United States Patent
Karnutsch et al.

(10) Patent No.: US 11,085,865 B2
(45) Date of Patent: Aug. 10, 2021

(54) ON-CHIP ABSORPTION SENSOR FOR DETERMINING A CONCENTRATION OF A SPECIMEN IN A SAMPLE

(71) Applicant: Hochschule Karlsruhe, Karlsruhe (DE)

(72) Inventors: Christian Karnutsch, Wörth am Rhein (DE); Jörg Knyrim, Karlsruhe (DE)

(73) Assignee: HOCHSCHULE KARLSRUHE

( * ) Notice: Subject to any disclaimer, the term of this patent is extended or adjusted under 35 U.S.C. 154(b) by 27 days.

(21) Appl. No.: 16/676,753

(22) Filed: Nov. 7, 2019

(65) Prior Publication Data

US 2021/0080370 A1    Mar. 18, 2021

(30) Foreign Application Priority Data

Sep. 17, 2019   (DE) ...................... 20 2019 003 812.4

(51) Int. Cl.
*G01N 15/06* (2006.01)
*H01S 5/12* (2021.01)
(Continued)

(52) U.S. Cl.
CPC .............. *G01N 15/06* (2013.01); *H01S 5/12* (2013.01); *H01S 5/36* (2013.01); *H01S 5/4087* (2013.01);
(Continued)

(58) Field of Classification Search
CPC ............. G01N 21/3504; G01N 21/783; G01N 21/0303; G01N 21/3554; G01N 21/05;
(Continued)

(56) References Cited

U.S. PATENT DOCUMENTS

| 5,767,976 A | 6/1998 | Ankerhold et al. |
| 6,995,348 B2 * | 2/2006 | Bradley ................. G01N 21/05 |
| | | 250/214 R |

(Continued)

FOREIGN PATENT DOCUMENTS

| WO | 0242747 | 5/2002 |
| WO | 03025552 | 3/2003 |
| WO | 2011150905 | 12/2011 |

OTHER PUBLICATIONS

Knoerzer, M. et al. "BANSAI—An optofluidic approach for biomedical analysis", Optofluid. Microfluid. Nanofluid. (2015), vol. 2 pp. 22-30.
Vannahme, C. "Integration Organischer Laser in Lab-on-Chip Systeme", KIT Scientific Publishing (2011). (Translation of abstract only).
(Continued)

*Primary Examiner* — Hoa Q Pham
(74) *Attorney, Agent, or Firm* — Onello & Mello, LLP

(57) ABSTRACT

An on-chip optical absorption sensor for determining a concentration of a specimen in a sample, the optical absorption sensor comprising at least one light emitting device, configured to emit light in a first direction and a second direction being opposite the first direction; at least one sample holder configured to receive the sample, wherein the at least one sample holder is at least partially transparent for the emitted light, such that at least a portion of the light emitted in the first direction can propagate through at least a portion of the sample holder; at least one first light detector being arranged to detect at least partially the intensity I of the propagated light having propagated through the sample holder in the first direction; at least one second light detector being arranged to detect at least partially the intensity I of the light emitted in the second direction.

20 Claims, 10 Drawing Sheets

(51) Int. Cl.
*H01S 5/36* (2006.01)
*H01S 5/40* (2006.01)
*G01N 15/00* (2006.01)

(52) U.S. Cl.
CPC ............... *G01N 2015/0053* (2013.01); *G01N 2015/0693* (2013.01)

(58) Field of Classification Search
CPC .... G01N 21/39; G01N 21/59; G01N 21/3577; G01N 2021/3125; G01N 2021/1704; G01N 33/0067; G01N 1/405; G01N 2201/0256
USPC .......................................... 356/432–440, 246
See application file for complete search history.

(56) References Cited

U.S. PATENT DOCUMENTS

| | | | | |
|---|---|---|---|---|
| 7,977,638 | B2* | 7/2011 | Frodl | G01N 21/3504 250/338.5 |
| 2008/0088821 | A1* | 4/2008 | Hurvitz | G01N 21/39 356/51 |
| 2019/0331651 | A1* | 10/2019 | Aljalal | G01N 21/39 |

OTHER PUBLICATIONS

Wang, Y. et al. "Nanoimprinted polymer lasers with threshold below 100 W/cm2 using mixed-order distributed feedback resonators", Optical Society of America (Jun. 17, 2013), vol. 21, No. 12, Optics Express 14364.

Klinkhammer, S. et al. "Optical spectroscopy with organic semiconductor lasers", Organic Photonics IV, SPIE (2010), vol. 7722, 77221I. Downloaded From: http://proceedings.spiedigitallibrary.org/ on May 23, 2017.

Ribeiro, M.R. et al. "BANSAI—A new approach for clinical chemistry analysis utilizing laser light", Optofluidic Systems, 7.2, pp. 247-257.

Kamutsch, C. et al. "Optofluidische On-Chip Absorptionsspektroskopie" (Optofluidic on-chip absorption spectroscopy), Forschung aktuell (2019), pp. 56-58 (Translation of abstract only).

Lu, M. et al. "Plastic distributed feedback laser biosensor", Applied Physics Letters 93 (2008) 111113/3. Downloaded Jan. 8, 2010.

Wang, Y. "Theory of Organic Semiconductor Lasers", Low Threshold Organic Semiconductor Lasers, Springer Theses, Springer International Publishing, Switzerland (2014), Chapter 2, pp. 9-32.

Woggon, T. "Organic Solid State Lasers for Sensing Applications", dissertation for Karlsruhe Institute of Technology, presented Jul. 7, 2011.

* cited by examiner

ON-CHIP ABSORPTION SENSOR FOR DETERMINING A CONCENTRATION OF A SPECIMEN IN A SAMPLE

CROSS REFERENCE TO RELATED APPLICATIONS

The present application claims priority to German Utility Model Application No. 20 2019 003 812.4, filed Sep. 17, 2019, which is incorporated herein by reference.

TECHNICAL FIELD

The invention relates to an on-chip optical absorption sensor for determining a concentration of a specimen in a sample, a system which comprises the on-chip optical absorption sensor, a method for determining a concentration of a specimen in a sample and a sandwich-type on-chip optical absorption sensor.

BACKGROUND

Lab-on-a-chip systems, such as optofluidic on-chip analysis systems allow the analysis of various samples and play an important role particularly in medical diagnostics. For example, blood may be analyzed directly in an ambulance, chemical and/or biological products may be monitored online in the chemical industry at a plant and pollutants can be detected in environmental analysis outside the lab. Absorption spectroscopy, which is a substantially nondestructive and/or non-invasive analysis method, has proven suitable for in situ analysis of biological or chemical samples. Optofluidic on-chip analysis systems using absorption spectroscopy may hence be applied for medical diagnosis, particularly in point-of-care diagnostics.

Optofluidic on-chip analysis systems based on absorption spectroscopy require a light source, such as a laser, particularly an organic laser. Organic laser systems, such as organic DFB lasers, may be miniaturized to match on-chip devices. An organic DFB laser can be based on a grating structure being implemented in a transparent substrate. The lamination procedure using a glass master or stamp negative for producing a grating structure of a DFB laser has been described in DE 10 2017 011 726 A1.

According to an aspect of the disclosure, the object relates to providing a reliable compact system to determine a concentration of a specimen in a sample.

The object is solved by an on-chip optical absorption sensor, a system, and a sandwich-type on-chip optical absorption sensor. Preferred embodiments are subject of the dependent claims.

SUMMARY

According to a first aspect, an on-chip optical absorption sensor is for determining a concentration of a specimen in a sample, the optical absorption sensor comprises
- at least one light emitting device, configured to emit light in a first direction and a second direction being opposite the first direction;
- at least one sample holder configured to receive the sample, wherein the at least one sample holder is at least partially transparent for the emitted light, such that at least a portion of the light emitted in the first direction can propagate through at least a portion of the sample holder;
- at least one first light detector being arranged to at least partially detect the intensity I of the propagated light having propagated through the sample holder in the first direction;
- at least one second light detector being arranged to at least partially detect the intensity I of the light emitted in the second direction.

Preferably the light emitting device may be a coherent light emitting device and the emitted light into the first and the second direction may be a coherent light. All aspects described herein, which refer to a coherent light emitting device and coherent light may also be realized with a light emitting device which is not a coherent light emitting device and which is not configured to emit coherent light. In other words, an on-chip optical absorption sensor may be configured such that the at least one light emitting device comprises at least one coherent light emitting device, configured to emit a light which is a coherent light in a first direction and a second direction being opposite the first direction.

In view of the above described coherence of the emitted light, according to an aspect, an on-chip optical absorption sensor is for determining a concentration of a specimen in a sample, the optical absorption sensor comprises
- at least one light emitting device, configured to emit light in a first direction and a second direction being opposite the first direction;
- at least one sample holder configured to receive the sample, wherein the at least one sample holder is at least partially transparent for the emitted light, such that at least a portion of the light emitted in the first direction can propagate through at least a portion of the sample holder;
- at least one first light detector being arranged to at least partially detect the intensity I of the propagated light having propagated through the sample holder in the first direction;
- at least one second light detector being arranged to at least partially detect the intensity I of the light emitted in the second direction.

The on-chip optical absorption sensors according to the above described aspects, i.e. on-chip optical absorption sensors including coherent and/or non-coherent light emitting devices, respectively emitting coherent or non-coherent light, can be used to determine a concentration of one or more specimens in one or more samples in a miniaturized portable setup. It is not required to carry a sample to a spectrometer or to carry a large spectrometer to the point-of-care, i.e., the location where it is required for the analysis, for example the ambulance or another position where a patient is located. The sample may be fluid, in particular a liquid sample. The specimen may be a substance of interest contained in the sample, for example the insulin contained in blood.

The on-chip optical absorption sensor is particularly compact, as the reference measurement, i.e., the detection of the reference intensity $I_0$, does not require further optical elements such as a mirror, a beam splitter or an optical bypass of the sample. However, beam splitters or mirrors may be used outside the on-chip optical absorption sensor. Further, the detection of the reference intensity $I_0$ may be performed substantially simultaneously with the detection of the intensity I attenuated by the sample.

Optionally, the light emitting device may comprise organic laser materials. Often, such organic laser materials have a short lifetime and degrade after a short time in an operation mode. Hence, the performance of the organic laser materials may vary and/or deviate and/or decay over time.

Further, the conditions, such as temperature and humidity, under which the on-chip optical absorption sensor may be used can vary over time. Hence, it may be advantageous that a reference measurement of the reference intensity $I_0$ is performed approximately at the same time, preferably substantially simultaneously with the detection of the intensity I attenuated by the sample.

According to a further aspect, the light emitting device may be configured as a substantially planar light emitting layer, wherein the normal direction of the light emitting layer may be substantially parallel to the first and second directions of the emitted light.

A substantially planar light emitting layer is particularly compact and can provide a large surface from which light can be emitted in the first and the second directions. Hence, also a substantially flat sample layer, having a small thickness in the first direction, can be efficiently analyzed, as a high amount of light can propagate through the sample. This allows provision of a very compact on-chip optical absorption sensor.

According to a further aspect, the light emitting device may comprise a vertically emitting laser comprising at least one distributed feedback laser, DFB, particularly an even-order DFB, a distributed Bragg reflector laser, DBR, a tapered laser, a vertical-cavity surface-emitting laser, VCSEL and/or a vertical external cavity surface-emitting laser, VECSEL.

Vertically emitting laser systems can be configured to provide light emission in two opposing directions, wherein the relation/ratio of intensities of the light emitted in the two opposing directions does not substantially vary over time. Accordingly, the light emitted in one direction may be used as a reference and the light emitted in the opposite direction may be used as a probe. Some above named laser systems may be simple, inexpensive, easy to produce and/or compact which is advantageous if applied in a portable on-chip device, particularly a single use on-chip device or an on-chip device comprising single-use elements.

According to a further aspect, the light emitting device may comprise an organic second order DFB laser, comprising a grating.

A second order Distributed Feedback (DFB) laser architecture may be used as a vertically emitting laser system. A second order DFB laser may be advantageous, as it can be produced in a very simple and inexpensive manufacturing process.

According to a further aspect, the light emitting device may comprise an array of light emitting elements, wherein the light emitting elements may be arranged in at least one column and are spaced apart by a distance $\Delta$.

According to a further aspect, the array of light emitting elements may comprise at least two columns of light emitting elements, wherein the at least two columns may be spaced apart by a distance $\beta$.

An on-chip optical absorption device may be customized, if an array of light emitting elements is provided. For example, some or all light emitting elements along one or more columns may emit light having a certain wavelength which differs from another wavelength being emitted by other light emitting elements of the same light emitting device. Hence, the concentration of one or more specimens of one or more samples may be detected with only one single on-chip optical absorption device.

Further, it may be efficient to only provide light emitting elements above a microfluidic channel, such that substantially all of the emitted light or at least a major portion of the light emitted in the first direction may propagate through the volume of the channel, which may comprise a sample in a measurement configuration.

The distances $\Delta$ and $\beta$ allow for isolation areas between different light emitting areas, which emit light having different wavelengths.

According to a further aspect, the sample holder may comprise a sample chamber which may include at least one sample chamber volume, denoted chamber volume herein, wherein the chamber volume may include microfluidic channels for receiving and guiding a fluid sample, and/or holding elements for holding the sample or the sample chamber. In other words, the sample chamber may comprise a volume (chamber volume), in which a sample, particularly a volume of a sample, denoted sample volume, may be received. If the chamber volume is substantially filled with a sample, the chamber volume equals the sample volume. The chamber volume is hence the maximum volume which can be filled with a sample.

The sample holder may be or comprise an empty space for positioning a solid or quasi solid, i.e., a soft but substantially not liquid or fluid sample. Such samples may include thin slices of a biological and/or a chemical sample, a tissue sample of a biopsy, a liquid and/or soft and/or solid sample which is positioned on a microscope slide or between two microscope slides, for example cells or blood either in a liquid environment or dried onto the microscope slide.

Holding elements may be used for holding the samples described above. Alternatively, holding elements may be used for holding a sample chamber. The holding elements may ensure that the sample or sample chamber may be positioned in the correct position with respect to the light emitting device and the first light detector. The holding elements may further ensure that the sample or sample chamber can be removed from the device and then repositioned in the device in substantially the same position as before.

The chamber volume may be used for receiving, guiding and holding or hosting a substantially fluid sample which has a sample volume. In general, a fluid may be a material which follows the rules of rheology, i.e., the flow of matter, primarily in a liquid state, but also as rheologic "soft solids" or solids. Such materials are in a state in which they show fluidic behavior. Examples of fluid states may be a liquid, a gas or a powder. A fluid may also be a combination of materials in states showing fluidic behavior, such as a liquid in which particles are suspended. The sample chamber allows handling of a liquid sample in a defined shape, with a defined sample thickness in the first direction being determined by the chamber volume, while avoiding contamination of the device with the sample or contamination of the sample with environmental specimens.

The chamber volume may comprise at least one microfluidic channel for receiving and guiding a fluid sample. A microfluidic channel has the advantage of only requiring minimal amounts of a sample. It may be that samples are very precious or available in minimal amounts only. In that case, microfluidic channels can receive a portion of a sample having a sample volume, i.e., for example a volume of a liquid sample, by means of capillary forces. Preferably, a chamber volume, and particularly a microfluidic channel, is provided with two ports which may be open ends exposed to the environmental pressure either applied to the port or possibly existent in the air. In that way, in a chamber volume, particularly in a microfluidic channel, a capillary force and/or an under- and/or overpressure force applied to one port of the microfluidic channels may suck and/or push the liquid at least partially into the chamber volume. Several chamber volumes, particularly microfluidic channels, may be connected, which is particularly useful if only one sample should be analyzed inside the sample chamber. Alternatively, chamber volumes, particularly microfluidic channels may be isolated from each other, such that several samples may be analyzed without risking a cross contamination of the several different samples inside one sample chamber.

Preferably, a sample chamber, and particularly a chamber volume, is substantially sterile or can be sterilized and is substantially inert, i.e., does not substantially react with a sample compound. According to another aspect, the sample chamber is a single use element which can be removed and disposed of after having filled the chamber volume with the sample and after having analyzed the sample.

According to a further aspect, the sample chamber may be configured as a substantially planar sample chamber layer, wherein the normal direction of the sample chamber layer may be substantially parallel to the first and second directions of the emitted light.

A substantially planar sample chamber layer may provide a chamber volume having a substantially constant thickness in the first and second directions of the emitted light.

According to a further aspect, at least two out of the light emitting device, the sample holder, the first light detector and the second light detector may be configured as removable and/or replaceable module units.

A modular design of the device using separately designed modules may be considered, such as sub-components, elements or units which may be combined, replaced or reassembled to form a complex modular device. Further, module units or modules may be removed from the modular device for maintenance, replacement or complete abandonment of use.

Elements of an optical on-chip absorption device such as the light emitting device, the sample holder, the first light detector and the second light detector and/or one or more filter elements may have different lifetimes. For example, the light emitting device may comprise an organic laser material which may degrade after a short period of operation, whereas a light sensor may have a long lifetime. Further, the light emitting device may be cheap and simple to produce whereas the light sensor may be substantially more expensive. Hence, it is an advantage if two elements are configured as modules, as they can be replaced at different times after their lifetimes have ended.

The same applies to a sample chamber which is configured for a single use. Hence, after one single measurement, the sample chamber may be replaced. This allows performance of a quick and efficient study of different samples without the need of cleaning, particularly sterilizing the chamber volume of one sample chamber. The sample chamber may be an inexpensive element. Hence, it may be more time and cost efficient to replace the sample chamber when it is configured as a module.

According to a further aspect, at least two out of the light emitting device, the sample holder, the first light detector and the second light detector may be integrally formed, i.e. formed as an integral unit.

If two or more elements, particularly modules have substantially the same or a similar lifetime, it may be advantageous to configure these two or more elements as a single unit rather than two units. Hence, the unit may be efficiently replaced, removed or positioned on or inside the optical on-chip absorption device. For example, it may be efficient to produce by means of 3D printing or any other layer-by-layer technique a light emitting device together with a sample chamber as an integral unit. The light emitting device may comprise a lasing material which substantially decays after a single use. Also the sample chamber may be configured for single use. Hence, it may be practical and compact to provide these two elements as a single integral unit.

On the other hand, alternatively or in addition, the light sensors which may have a longer lifetime may be integrally formed with each other providing a space between them to position a sample and a light emitting device therein. This may be useful, as the light sensors may have substantially the same or similar lifetimes and may use the same electric or data transfer infrastructure.

According to a further aspect, the on-chip optical absorption sensor may further comprise at least one filter element which may be configured to allow transmission of at least a portion of the emission wavelength range of the emitted light.

A filter element may filter out a wavelength of a pump radiation from a pump laser which is required to excite the laser material, such that the light detector is substantially prevented from detecting the intensity of the pump radiation. For example, the filter element may be a notch filter, which is a very narrow bandwidth band-stop filter. Hence, only the (coherent) light emitted from the light emitting device may pass through the filter.

A filter element may also allow a light of a certain wavelength emitted from the light emitting device to pass through, such that only an intensity of this wavelength may be detected at the light detectors.

At least one filter element may be positioned between the light emitting device and the second light detector and/or between the light emitting device and the first light detector, particularly between the sample holder or sample chamber and the first light detector.

If the light emitting device is configured to emit light in a certain wavelength range or having different wavelengths, it may be advantageous to provide one or more filters which each allow transmission of light having an individually selected wavelength of the different wavelengths emitted by the light emitting device. The filter may comprise different areas with different filter materials, such that light of different wavelengths can pass the filter at different specific locations. In other words, a filter of one filter layer may only allow passage of a first wavelength or a first wavelength range at a first position, whereas another filter of the same filter layer may only allow passage of a second wavelength or a second wavelength range at a second position. Therefore, one sample can be analyzed with different wavelengths at different locations of a sample chamber layer in order to determine the respective concentrations of different specimens in the sample. The on-chip optical absorption sensor may hence be used substantially as a spectrometer.

Alternatively, at least one of the first and second light detectors may be configured to only detect light in a wavelength range that does not include the wavelength of the pump radiation.

According to a further aspect, the on-chip optical absorption sensor may have at least one sandwich structure of stacked layers, the one sandwich structure may comprise:
the light emitting device which may be configured as a substantially planar light emitting layer;
the sample holder which may be configured as a substantially planar sample chamber layer;
the first light detector which may be configured as a first light detection layer; and the second light detector which may be configured as a second light detection layer; wherein 1. the first light detection layer, 2. the sample chamber layer, 3. the planar light emitting layer and 4. the second light detection layer may be stacked in this order 1. to 4. along the second direction of the emitted light.

A sandwich structure of stacked layers allows a very compact on-chip optical absorption sensor. The on-chip optical absorption sensor is portable and can be taken easily to the point-of-care.

According to a further aspect, the on-chip optical sensor may be configured for determining concentrations of one or more specimens in at least two samples.

It may be useful and efficient to determine concentrations of the specimen in at least two samples, as for example specimens of two different samples might be indicative for a state to be assessed. For example, it may be necessary to analyze the blood and the urine of a patient to determine a condition of the patient. Hence, a single on-chip optical sensor may be used to perform this assessment.

According to a further aspect, the on-chip optical absorption sensor may comprise at least two sandwich structures for determining in each of the sandwich structures the concentration of a specimen of one of the samples.

If two different samples should be analyzed in view of the specimen, for example the blood of a patient at a first point in time and the blood of the patient at a second point in time, it may be advantageous to provide these samples in an on-chip optical sensor having two identical sandwich structures. This on-chip optical sensor may be compact and easy to handle.

If one single sample should be analyzed in view of two different specimens, for example the blood of a patient should be analyzed in view of blood sugar and insulin, a portion of the sample may be provided in a sample chamber of a first sandwich structure having a first light emitting device and another portion of the sample may be provided in a sample chamber of a second sandwich structure having a second light emitting device, wherein one wavelength of the first light emitting device is specific for the specimen blood sugar and the other wavelength of the second light emitting device is specific for the specimen insulin. In other words, one wavelength $\lambda_1$ of the first light emitting device may specifically be absorbed by an analyte, a marker, a dye and/or a substance being indicative of the first specimen, i.e. the blood sugar, whereas the other wavelength $\lambda_2$ of the second light emitting device may specifically be absorbed by an analyte, a marker, a dye and/or a substance being indicative of the second specimen, i.e. the insulin.

Similarly, two different samples may be analyzed in view of two different specimens. For example a first sample taken from the patient in a first moment in time may be analyzed in view of blood sugar and a second sample taken from the patient in a second moment in time may be analyzed in view of insulin.

According to a further aspect, the on-chip optical absorption sensor may comprise a first light emitting device, which may be configured to emit light having a first wavelength $\lambda_1$ and a second light emitting device, which may be configured to emit light having a second wavelength $\lambda_2$, wherein the first wavelength $\lambda_1$ differs from the second wavelength $\lambda_2$.

The first light emitting device may be provided in a first sandwich structure and the second light emitting device may be provided in a second sandwich structure. Both light emitting devices are configured as individual light emitting layers. Alternatively or in addition, a light emitting device of one single light emitting layer may comprise two light emitting elements, wherein one light emitting element emits light having the first wavelength $\lambda_1$ and the other light emitting element emits light having the second wavelength $\lambda_2$.

As already indicated above, it may be possible to analyze one or more samples in view of a concentration of one or more specimens. This may be considered multiplexed point-of-care testing. While point-of-care testing is the quantification of one single specimen or analyte from one in vitro (e.g. blood, plasma or urine) sample, multiplexed point-of-care testing is the simultaneous on-site quantification of various specimens or analytes from a single sample or from several samples.

For example, this may be efficient to assess a condition of a patient based on multiple parameters. A diagnosis may hence be reliable even though performed outside a lab. An entire "lab" may literally be provided on a single "chip". In other words, several diagnostics may be provided in a portable compact on-chip device, which may be handheld. The on-chip optical sensor may be compact, but may also be a table top device rather than a handheld device.

According to a further aspect, the on-chip optical absorption sensor may further comprises at least one reference holder configured to receive a reference substance, wherein the reference holder may be at least partially transparent for the emitted light, such that at least a portion of the light emitted in the second direction can propagate through at least a portion of the reference holder.

Preferably, the reference holder comprises a reference chamber, particularly in the case when a sample chamber is also provided. In that case, it may be particularly preferable that the sample chamber and the reference chamber are identical in composition, shape, physical and optical properties. In particular, the sample chamber and the reference chamber provide the same chamber volume and the same thickness of the chamber volume along the first direction.

Preferably, the reference substance is at least one substance, such as a liquid substance, which is also contained in the sample. Particularly, the reference substance contains or substantially consists of a solvent which is contained in the substance of the sample. The solvent may be used for example to substantially dissolve, disperse and/or emulsify the specimen.

The on-chip optical absorption sensor according to this aspect has the advantage that the reference intensity already comprises factors such as attenuation effects originating from the reference substance. For example, if an aqueous buffer solution, for example phosphate buffer saline, is used as a solvent in the sample, the same aqueous buffer solution is preferably used as a reference. The aqueous buffer solution may cause an absorption. In order to distinguish between the absorption effect of the buffer solution and the specimen, the same buffer solution is preferably used in the reference chamber, particularly such that the light emitted into the first direction and the light emitted into the second direction propagate through the sample and the reference, respectively, wherein the sample and the reference have the same optical path length. As a result the concentration of the specimen can be determined even more precise, as the intensity I already comprises potential effects which originate from the solvent and/or the material of the sample chamber and/or the optical properties of the sample chamber and/or other aspects related to the sample or the sample chamber.

Other effects may for example also origin from reflections on the surface of the sample chamber, absorbance of the sample chamber material, light scattering effects, etc.

Instead of a sample chamber, a sample, for example a dried sample, may be supported by a slide for example a microscope slide comprising a glass slide. The sample holder may be configured to hold the microscope slide between the light emitting source and the first detector. Hence, also the reference holder may be configured to hold a microscope slide between the light emitting source and the second detector.

A particular advantage may be achieved by using a material for the sample chamber and/or the reference chamber, such as glass and/or a polymer. As glass and/or several polymers can in many cases filter at least partially light in the UV region. The sample chamber itself can hence act as a filter element to filter the pump radiation from the pump laser. Not only the materials used for the sample chamber and/or reference chamber may absorb light in the UV region but also solvents such as water can filter at least partially light in the UV region.

Alternatively or in addition, filter elements may be used to protect the light sensors from receiving pump radiation. Such filter elements may be arranged between the light emitting source and the first detector and/or between the light emitting source and the second detector. Particularly, filter elements may be arranged between the light emitting source and the sample chamber and/or between the light emitting source and the reference chamber. Alternatively or in addition, filter elements may be arranged between the sample chamber and the first detector and/or between the reference chamber and the second detector.

According to a further aspect, a system comprises the on-chip optical absorption sensor according to any of the described aspects and at least one processing unit for determining the concentrations of the specimen in the sample according to:

$$c = -\ln\left(k_I \frac{I}{I_0}\right) / (d\varepsilon^*)$$

wherein I is an intensity of the propagated light detected by the first light detector, $I_0$ is a reference intensity of the light emitted in the second direction detected by the second light detector, $\varepsilon^*$ is an extinction coefficient of the specimen at a wavelength $\lambda$ of the light taking into account the natural logarithm, c is a molar concentration of the specimen in the sample, d is a thickness of the sample in the first direction and $k_I$ is a factor taking into account the relation between the intensities $I_D$, $I_U$ of light being emitted into the first and the second directions.

$k_I$ may for example equal 1 if the amount, i.e. the intensity of light being emitted into the first direction equals the intensity of light emitted into the second direction. Alternatively, $k_I$ may for example equal 0.5 if the amount, i.e. the intensity of light being emitted into the first direction equals half the intensity of light emitted into the second direction. The factor $k_I$ can be calculated from $$k_I = \frac{I_D}{I_U}$$

wherein $I_D$ is the intensity of the light being emitted into the first direction (downwards from the light emitting device) and $I_U$ is the intensity of the light being emitted into the second direction (upwards from the light emitting device).

The factor $k_I$ deviates from 1 if the light emitting device emits light, wherein the light emitted into the first direction has a substantially different intensity than the light emitted into the second direction. At the same time, over time the intensities may also vary, for example fluctuate, decrease or increase, however, the relation expressed in the factor $k_I$ is at least over a period of time, for example during a single measurement substantially stable, i.e. constant. Further, the factor $k_I$ may also vary for different light emitting devices of different on-chip optical absorption sensors, for example due to variations in the preparation and production steps. Moreover, the factor $k_I$ may vary spatially along the surface of the light emitting device. Hence, it is preferable to perform a calibration measurement at least once, preferably before a measurement of a sample, to obtain the values $I_D$ and $I_U$ in order to determine the factor $k_I$. It may even be preferable to perform such one or more calibration measurements before each measurement of one or more samples using one single on-chip optical absorption sensor. Alternatively, a calibration measurement may be performed after one or more measurements of one or more samples.

When a calibration measurement is performed to obtain the values $I_D$ and $I_U$, preferably all optical elements remain in the on-chip optical absorption sensor, as potential reflections, attenuations and/or deviations or other optical effects originating from the optical elements can be taken into account in the calibration measurement data.

Alternatively, all optical elements except the light emitting device and the light detectors may be removed, if this is possible. For example, the sample chambers may be removed. If for example a light emitting device is formed with a sample chamber as an integral unit and/or permanently connected unit, the sample chamber remains in the on-chip optical absorption sensor during a calibration measurement, however the chamber volume may remain unfilled or filled only with a liquid solution which does not contain the specimen.

The values $I_D$ and $I_U$ may be considered the intensities I and $I_0$ measured at the first and second light detectors in a calibration configuration, i.e. a configuration used for a calibration measurement, as described above in the preferred or the alternative configuration. Particularly a calibration measurement is performed in the absence of a sample, particularly a specimen, i.e. without placing a sample with a specimen into the sample holder and/or the sample chamber.

The extinction of a specimen at a certain wavelength $\lambda$ is:

$$E_\lambda = \log_{10}\left(k_I \frac{I_0}{I_1}\right) = \varepsilon_\lambda * c * d$$

wherein $I_1$ is an (attenuated) intensity of the propagated light detected by the first light detector, $I_0$ is a reference intensity of the light emitted in the second direction detected by the second light detector, $\varepsilon_\lambda$ is a (decadic) extinction coefficient (often denoted absorption coefficient) of the specimen at a wavelength $\lambda$ of the light emitted into the first direction, c is a molar concentration of the specimen in the sample and d is a thickness of the sample in the first direction.

$\varepsilon_\lambda$ is a specific variable for the specimen (the absorbing substance) and may depend, inter alia, on the pH-value or the solvent. The concentration c may be provided in Mol/l and $\varepsilon_\lambda$ may be provided as a decadic molar extinction coefficient, for example in I·mol$^{-1}$·cm$^{-1}$. The relation between the decadic extinction coefficient $\varepsilon_\lambda$ and the extinction coefficient of the specimen at a wavelength $\lambda$ of the light taking into account the natural logarithm $\varepsilon^*$ is $$\varepsilon_\lambda = \log_{10}(e)\varepsilon^*$$

The processing unit may be part of a portable handheld device which also comprises the on-chip optical absorption sensor. The results calculated by the processing unit may be immediately shown on a display of the portable handheld device. Hence, the concentration of a specimen in the sample can be determined directly, i.e., quickly or in a short time after having applied the sample and having started the measurement. It may be important that a diagnosis is performed quickly, for example if a medical doctor must decide about an action to be taken when a patient is in an acute but unidentified state of illness. The system comprising the on-chip optical absorption sensor may be well suited for such situations.

Further, all previously named advantages may also apply to the system, if the aspects above are included in the system.

According to an example for better understanding the invention, a method for determining a concentration of a specimen in a sample comprises the steps of:
providing the on-chip optical absorption sensor according to any of the described aspects;
providing the sample in the sample holder;
stimulating the light emitting device to emit light;
at least partially detecting
the intensity I of the propagated light emitted in the first direction and having propagated through the sample holder by means of the first light detector; and
the intensity $I_0$ of the light emitted in the second direction by means of the second light detector; and
determining the concentration of the specimen in the sample according to:

$$c = -\ln\left(k_I \frac{I}{I_0}\right) / (d\varepsilon^*)$$

wherein I is an attenuated intensity of the propagated light detected by the first light detector, $I_0$ is a reference intensity of the light emitted in the second direction detected by the second light detector, $\varepsilon^*$ is an extinction coefficient of the specimen at a wavelength $\lambda$ of the light, c is a molar concentration of the specimen in the sample, d is a thickness of the sample in the first direction and $k_I$ is a factor taking into account a the relation between the intensities of light being emitted into the first and the second directions.

According to a preferred example, the method may also comprise
providing a reference chamber in a reference holder;
providing a reference substance in the reference chamber;
wherein the light emitted in the second direction passes at least partially the reference chamber, particularly the reference substance to take into account attenuation effects which originate from the setup, optical elements, a solvent and/or other impacts but do not originate from the specimen in substance, but for example from a compound of the sample substance, such as a solvent.

According to a preferred example, the method may also comprise a calibration measurement which may comprise detecting $I_0$ and I before providing the sample or a sample chamber in the sample holder and optionally before providing a reference chamber, in order to determine a factor $$\frac{I_D}{I_U} = \frac{I}{I_0} = k_I$$

wherein, in this case, $I_0$ and I equal respectively $I_U$ and $I_D$, which are the intensities measured at the second and the first light detectors, respectively, in the absence of a sample and optionally a reference substance.

All previously named advantages may also apply to the method, if the aspects above are reflected in the method.

According to a further aspect, a sandwich-type on-chip optical absorption sensor is for determining a concentration of a specimen in a sample, the optical absorption sensor comprises in a stacked configuration along the first direction
a second light detector which is configured as a second light detection layer;
a light emitting device comprises an organic second-order DFB laser grating configured as a substantially planar light emitting layer and configured to emit light into a first direction and a second direction, the second direction being opposite to the first direction;
a sample holder comprises at least one microfluidic channel for receiving and guiding a fluid sample configured as a substantially planar sample chamber layer, wherein the microfluidic channel is at least partially transparent for the emitted light such that at least a portion of the light emitted in the first direction can propagate through at least a portion of the microfluidic channel of the sample chamber layer as propagated light; and
a first light detector which is configured as a first light detection layer; wherein
an intensity $I_0$ of the light emitted in the second direction can be at least partially detected by the second light detector as a reference intensity;
an intensity I of the propagated light can be at least partially detected by the first light detector as a probe intensity for determining the concentration of the specimen in the sample.

All previously named aspects which are compatible with the sandwich-type on-chip optical absorption sensor may be included therein. Consequently, all previously named advantages may be achieved in the sandwich-type on-chip optical absorption sensor, if the aspects are included therein.

According to a further aspect, the light emitting device may be configured as a vertically emitting laser comprising at least one of a DFB laser, a DBR laser, and a VCSEL. Optionally, the arrays are configured in rectangular arrangements of columns and rows of light emitting elements. However, also other array structures can be implemented such as circular structures.

According to a further aspect, the first and the second directions may be substantially parallel to normal directions of the first light detection layer, the second light detection layer, the light emitting layer and the sample chamber layer.

The first and second light detection layers may however be slightly tilted with respect to the light emitting layer in order to avoid multiple reflections between the corresponding detection layer or surface and the light emitting layer or surface.

In the following, some example embodiments will be described in detail, wherein the invention should not be understood to be limited to the example embodiments described. Single features being described in a particular embodiment may be arbitrarily combined, given that they are not excluding each other. In addition, different features which are provided together in the example embodiments are not to be considered restrictive to the invention.

Particularly, all described examples, embodiments and aspects may be realized with coherent and non-coherent light, being emitted respectively by coherent light emitting devices and non-coherent light emitting devices, wherein non-coherent light emitting devices are herein merely denoted "light emitting devices".

BRIEF DESCRIPTION OF DRAWINGS

FIG. 4a is a front view of a light emitting element of a light emitting device according to an aspect;

FIG. 4b is a front exploded view of a detail of the light emitting element of FIG. 4a;

FIG. 5 is a front exploded view of a detail of a light emitting device comprising the light emitting element of FIG. 4a;

DETAILED DESCRIPTION OF EXAMPLE EMBODIMENTS

Figure 1:
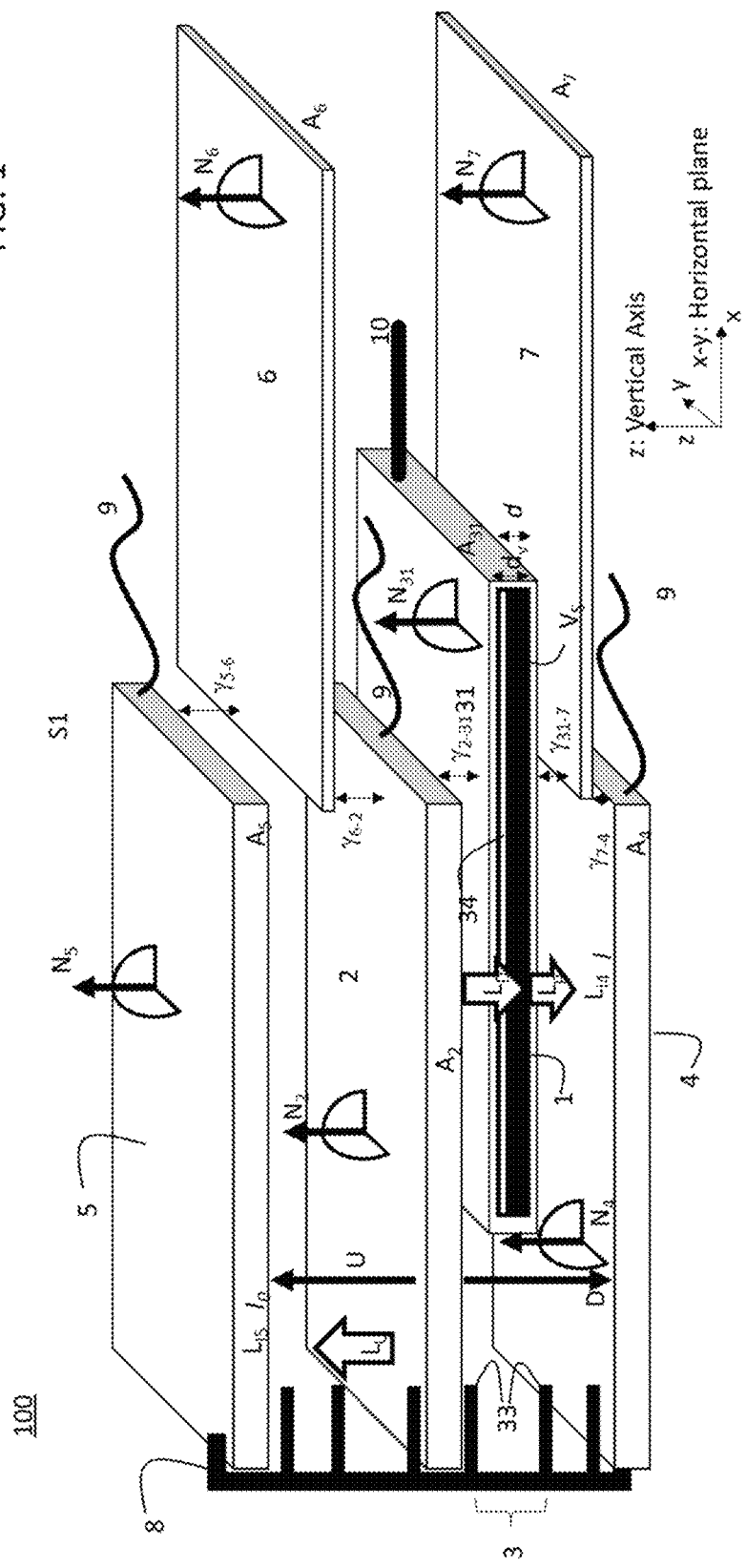
FIG. 1 is a front exploded view of an on-chip optical absorption sensor according to an aspect.

FIG. 1 is a front exploded view of an on-chip optical absorption sensor 100. Particularly, an example of a sandwich structure S1 is shown in FIG. 1 and will be described in the following.

Between two light detectors, a first light detector 4 and a second light detector 5, a light emitting device 2 is positioned or arranged. A light detector 4, 5 may also be considered a light sensor and/or a photodetector.

The light emitting device 2 emits light $L_D$, $L_U$ at least partially into a first direction D and a second direction U. The first and second directions D, U are substantially opposite to each other, i.e., having an angle of substantially 180° between each other. In the schematic view of FIG. 1 the first direction D points "downward" with substantially 90° from the horizontal plane xy, whereas the second direction U points substantially "upward" with 90° from the horizontal plane xy, both being parallel to a vertical axis z.

Between the first light detector 4 and the light emitting device 2, a sample holder 3 is located. The sample holder 3 may be considered a free space which is limited or confined substantially in the first and second directions D, U, i.e., in the vertical z-direction, by the surfaces of the first light detector 4 and the light emitting device 2, respectively. The sample holder 3 may in addition provide holding elements 33 for holding a sample 1 or a sample chamber 31, as indicated in the FIG. 1. The sample 1 may be substantially fluid, particularly liquid. The fluid may be filled into the chamber volume 34 of the sample chamber 31, as indicated in FIG. 1. The sample 1 is configured and/or layered in such a way that it has a certain layer thickness d in the first direction D.

A fluid may be a material in a state having a fluidic behavior, such as a liquid, a gas or a powder. A fluid may also be a combination of materials in states showing a fluidic behavior such as a liquid in which particles are suspended. Other examples for mixed materials with different states which may show fluid behavior are aerosols, foams, suspensions, emulsions and mixes of powders. Alternatively, the sample 1 may also be substantially solid and/or soft but not fluidic. For example, the sample 1 may be a thin cut of a material, particularly a biological dissection. The sample holder 3 may have holding elements 33 for receiving, holding, fixing and/or arranging a non-fluidic sample 1. In addition or alternatively, the sample holder 3, particularly the holding elements 33 may be configured to receive, hold, fix and/or arrange the sample chamber 31 including a chamber volume 34 for receiving, guiding and/or hosting a fluid sample, particularly a liquid sample.

In a measurement configuration, i.e., when a concentration of a specimen in a sample 1 is to be determined, a sample 1 is placed, arranged and/or positioned into the sample holder 3. The arrangement is such that the light $L_D$ emitted by the light emitting device 2 in the first direction D can propagate at least partially through a portion of the volume of the sample 1. The portion of light which leaves the sample holder 3 towards the first direction D, for example after having passed or propagated through the sample and the sample chamber 31 is referred to as propagated light $L_p$. The intensity I of the propagated light $L_p$ (or at least of a portion thereof) can then be detected by the first light detector 4. The intensity of the propagated light $L_p$ may be substantially equal to the intensity of the light $L_D$ emitted by the light emitting device 2 in the first direction D in the case when there is no sample 1 or sample chamber 33 or any other element placed between the light emitting device 2 and the first light detector 4.

The light being detected at the first light detector 4 may be considered as incoming light $L_{14}$ at the first light detector 4. The propagated light $L_p$ may be attenuated light, wherein attenuation maybe caused at least partly by the interaction with the specimen in the sample 1. The interaction between the light $L_D$ passing the sample and the specimen in the sample 1 may comprise energy transfer in molecular vibration and scatter events. After having passed the sample 1, the propagated light $L_p$ might not have properties any longer. For example, scatter events may destroy the property of the light $L_D$ such that the propagated light $L_p$ may not be coherent. The intensity of light might also be referred to as the amount of light.

The light emitting device 2 emits light $L_U$ at least partially in the second direction U. The intensity $I_0$ of incoming light $L_{15}$ which is detected at the second light detector 5 may be substantially identical to the intensity of light $L_U$ being emitted from the light emitting device 2 in the second direction U. This is particularly the case, when no element is positioned between the light emitting device 2 and the second light detector 5.

The light emitting device 2 emits lights $L_D$ and $L_U$ into a first direction D and a second direction U, respectively, wherein the intensity $I_D$ of the light $L_D$ emitted in the first direction D may be substantially identical to the intensity $I_U$ of the light $L_U$ emitted in the second direction U, at least for a period of time, particularly for a period of time required for one measurement:

$$I_D \cong I_U$$

Alternatively, the intensity $I_D$ of the light emitted in the first direction D may substantially equal the intensity $I_U$ of the light emitted in the second direction U multiplied by a factor $k_I$ which is substantially constant over at least a short period of time, i.e. over at least approximately 5 s, particularly over at least approximately 15 s, more particularly over at least approximately 30 s. In general, a short period of time may be for example approximately 2 s to 10 minutes.

In other words, the relation or ratio between the intensity $I_D$ of the light emitted in the first direction D and the intensity $I_U$ of the light emitted in the second direction U is substantially constant over at least a short period of time:

$$\frac{I_D}{I_U} = k_I \cong \text{const.}$$

$k_I$ may for example be 1 in a case, in which the intensity $I_0$ of light $L_D$ being emitted into the first direction D equals the intensity $I_U$ of light $L_U$ being emitted into the second direction U. Alternatively, $k_I$ may for example equal 0.5 in a case, in which the intensity $I_D$ of light $L_D$ being emitted into the first direction D equals half the intensity $I_U$ of light $L_U$ being emitted into the second direction U.

A calibration measurement is regularly performed to determine the values $I_D$ and $I_U$. When a calibration measurement is performed to obtain the values $I_D$ and $I_U$, preferably all optical elements remain in the on-chip optical absorption sensor, as potential reflections, attenuations and/or deviations or other optical effects originating from the optical elements can be taken into account in the calibration measurement data.

Alternatively, all optical elements except the light emitting device 2 and the light detectors 4, 5 may be removed, if this is possible, particularly the sample chambers 31 may be removed. If for example a light emitting device 2 is formed with a sample chamber 31 as an integral or permanently connected unit, the sample chamber remains in the on-chip optical absorption sensor, however the chamber volume Vs may remain unfilled or filled only with a liquid solution which does not contain the sample 1 and particularly not the specimen.

The values $I_D$ and $I_U$ may be considered the intensities I and $I_0$ measured at the first and second light detectors 4, 5 in a calibration configuration, i.e. a configuration used for a calibration measurement, as described above in the preferred or the alternative configuration. Particularly a calibration measurement is performed in the absence of a sample 1, particularly a specimen, i.e., without placing a sample 1 with a specimen into the sample holder 3 and/or the sample chamber 31.

The factor $k_I$ deviates from 1 in a case, when the light emitting device 2 emits light $L_D$, $L_U$ into the first D and second directions U, respectively having substantially different intensities $I_D$, $I_U$. At the same time, over a period of time the intensities $I_D$, $I_U$ may also vary, for example fluctuate or decrease, however, the relation expressed in the factor $k_I$ is at least over a period of time, for example during a measurement, substantially stable, i.e. constant.

Further, the factor $k_I$ may also vary for different light emitting devices 2 of different on-chip optical absorption sensors, for example due to variations in the preparation and production steps.

Moreover, the factor $k_I$ may vary spatially along the surface of the light emitting device 2. Hence, it is preferable to perform a calibration measurement at least once, to obtain the values $I_D$ and $I_U$ in order to determine the factor $k_I$. It may even be preferable to perform such calibration measurements before each measurement using one single on-chip optical absorption sensor.

The intensity $I_0$ of incoming light $L_{15}$ which is detected at the second light detector 5 is hence used as a reference intensity for determining the concentration of the specimen in the sample 1 according to:

$$c = -\ln\left(k_I \frac{I}{I_0}\right) / (d\varepsilon^*)$$

wherein I is an attenuated intensity of the propagated light $L_P$ detected by the first light detector 4, $I_0$ is a reference intensity of the light $L_U$ emitted in the second direction U detected by the second light detector 5, $\varepsilon^*$ is an extinction coefficient of the specimen at a wavelength λ of the light, c is a molar concentration of the specimen in the sample 1 and d is a thickness of the sample 1 in the first direction D.

The light emitting device 2 may be excited by means of a pump laser. The pump laser emits pump radiation 11 at a certain wavelength $\lambda_{11}$ or wavelength range (not shown in the FIG. 1) at which the laser medium, e.g. an organic laser material 23 (also not shown in the FIG. 1), absorbs and can be excited to emit light $L_D$ and $L_U$.

In order to prevent that the light detectors 4, 5 to detect the intensity of the pump radiation and/or pump light 11, filter elements 6, 7 may be positioned between the light detectors 4, 5 and the light emitting device 2. For example, a filter element 7 may be positioned between the first light detector 4 and the sample chamber 31. Alternatively or in addition, a further filter element 6 may be positioned between the second light detector 5 and the light emitting device 2. The filter elements 6, 7 preferably filters out substantially all the pump radiation 11 being emitted by the pump laser, such that the intensity of the pump radiation 11 at the wavelength or wavelength range $\lambda_{11}$ is substantially zero after having passed the filter elements 6, 7. Preferably, the light $L_D$ and $L_u$ and the propagated light $L_P$ are not blocked or significantly attenuated by the respective filter elements 6, 7 such that the intensity of these light portions is not filtered by the filters 6, 7. In other words, the light $L_D$ and $L_u$ and the propagated light $L_P$ can pass the filters 6, 7 without substantially being attenuated or modified.

The sample chamber 31 may have a port 10 for filling a fluid sample 1 into the volume 34 of the sample chamber 31, as indicated in FIG. 1. In addition, a second port may allow the air or material inside the volume 34 to escape when the sample 1 is filled into the volume 34.

The light detectors 4, 5 are each provided with a cable 9 in this particular drawing of FIG. 1. Alternatively, the light detectors 4, 5 may not require a cable, for example if energy is supplied by a battery and/or data are transferred in a wireless fashion. The cables 9 may be for energy supply and/or data transfer. There may be also more than one cable 9 per detector 4, 5 for energy supply and/or data transfer. Similarly, the light emitting device 2 is in this particular drawing provided with a cable 9 for energy supply and/or for providing a voltage and/or for coupling pump radiation 11 into the lasing material, wherein the cable is in general an optional element. In the latter case, the cable may be a fiber optic for guiding light. The cable 9 on the light emitting device 2 is optional, hence it may not be required in some cases. Particularly, the pump radiation (not shown in FIG. 1) may be provided directly from irradiating the surface of the light emitting device 2 without the requirement of a cable 9, such as a fiber optic.

In FIG. 1, the on-chip optical absorption sensor 100 is in a stacked configuration in which all elements are substantially configured as single pieces. The stacked configuration S1 is such that the first light detector 4, the filter 7, the sample holder 3 including the sample chamber 31, the light emitting device 2, the filter 6 and the second light detector 5 are stacked or configured to be stacked along the second direction U. The above elements are configured to be stacked and/or arranged into or onto a mount 8. The above elements may be permanently or temporarily arranged in or at the mount. Alternatively, some of the above elements may be permanently arranged in or at the mount whereas other elements may be removed, replaced, exchanged and/or added. For example, the sample chamber 31 may be a single use sample 31 which is replaced after a single use. Also, for example, the light emitting device 2 may be exchanged. Further, for example, also one or both of the filter elements 6, 7 may be replaced.

The stacked configuration S1 may be such that the first light detector 4 is configured as a first light detection layer $A_4$, the filter 7 is configured as a first filter layer $A_7$, the sample holder 3 including the sample chamber 31 is configured as a sample chamber layer $A_{31}$, the light emitting device 2 is configured as a light emitting layer $A_2$, the filter 6 is configured as a second filter layer $A_6$ and the second light detector 5 is configured as a second light detection layer $A_5$, wherein all layers are stacked or configured to be stacked along the second direction U.

At least some elements may be stacked such that their surfaces are substantially flush with the surfaces of the neighboring elements. At least some elements may be stacked such that their surfaces are spaced apart by a gap from the surfaces of the neighboring elements. For example, as indicated in the drawing, the surface of the second detector 5 facing towards the first direction D is spaced apart by distance $\gamma_{5-6}$ from the surface of the filter element 6 facing towards the second direction U. The surface of the filter element 6 facing towards the first direction D is spaced apart by a distance $\gamma_{6-2}$ from the surface of the light emitting device 2 facing towards the second direction U. The surface of the light emitting device 2 facing towards the first direction D is spaced apart by a distance $\gamma_{2-31}$ from the surface of the filter element 7 facing towards the second direction U. The surface of the filter element 7 facing towards the first direction D is spaced apart by a distance $\gamma_{7-4}$ from the surface of the first light detector 4 facing towards the second direction U. These distances may be substantially constant throughout the respective surface areas.

If the surfaces do not substantially lay flush with each other, the distances may vary individually between approximately 100 μm and 1 cm, optionally between approximately 500 μm and 5 mm, more optionally between approximately 800 μm and 2 mm. When the surfaces are flush with each other, the distances may be in the range of 0 to 100 μm.

The sample holder 3, particularly a sample chamber 31 and/or a microfluidic channel structure 32 provides a chamber volume 34 having a volume thickness $d_V$ in the first direction D. A sample 1 which is filled into the chamber volume 34 may hence have a thickness $d \leq d_V$ depending on the volume portion that is filled with the sample 1. The thickness $d_V$ may vary between approximately 5 μm and 8 mm, optionally between approximately 100 μm and 3 mm and more optionally between approximately 300 μm and 1 mm. A liquid sample 1 may flow into the chamber volume 34. The liquid sample may flow through the chamber volume 34 from an entrance port 10 to an exit port 10 to exit the chamber volume 34.

The sample volume Vs which may be received by a chamber volume 34 can range between approximately 500 ml in a large optical on-chip absorption device and 5 μl in a small optical on-chip absorption device. Optionally, the sample volume Vs may range between approximately 30 μl and 1 ml and, more particularly between approximately 100 μl and 800 μl. If the chamber volume 34 is completely filled with the sample volume Vs, the chamber volume 34 equals the sample volume Vs.

The normal directions of each of the surfaces or planes, having substantially a 90° angle with the surfaces, are substantially parallel to the first and the second directions D, U. In more detail, the normal direction $N_5$ of the second light detector 5, the normal direction $N_6$ of the filter 6, the normal direction $N_2$ of the light emitting device 2, the normal direction $N_{31}$ of the sample chamber 31, the normal direction $N_7$ of the filter 7, and the normal direction $N_4$ of the first light detector 4 are the respective normal directions of the xy-planes of the respective layers and are substantially parallel to each other and substantially parallel to the first and the second directions D, U. In FIG. 1, the normals directions are parallel to the vertical axis z and perpendicular to the horizontal plane xy. The main planar surfaces of the layers are substantially parallel to the horizontal plane xy.

The mount 8 may be configured to receive further optical elements, such as for example an optical waveguide for coupling the pump radiation 11 into the light emitting device 2. Moreover, a layer-like device which can emit a pump radiation 11, particularly overlapping the UV region, may be positioned near the light emitting device 2, such that the pump laser is integrated into the sandwich structure. For example, such a layer-like device may comprise a pump laser component which can be positioned above and/or below the light emitting device 2, such that pump light (not shown in FIG. 1) can excite the light emitting device 2 from above and/or below, particularly from above and/or below sides being incident from an angle.

Figure 2:
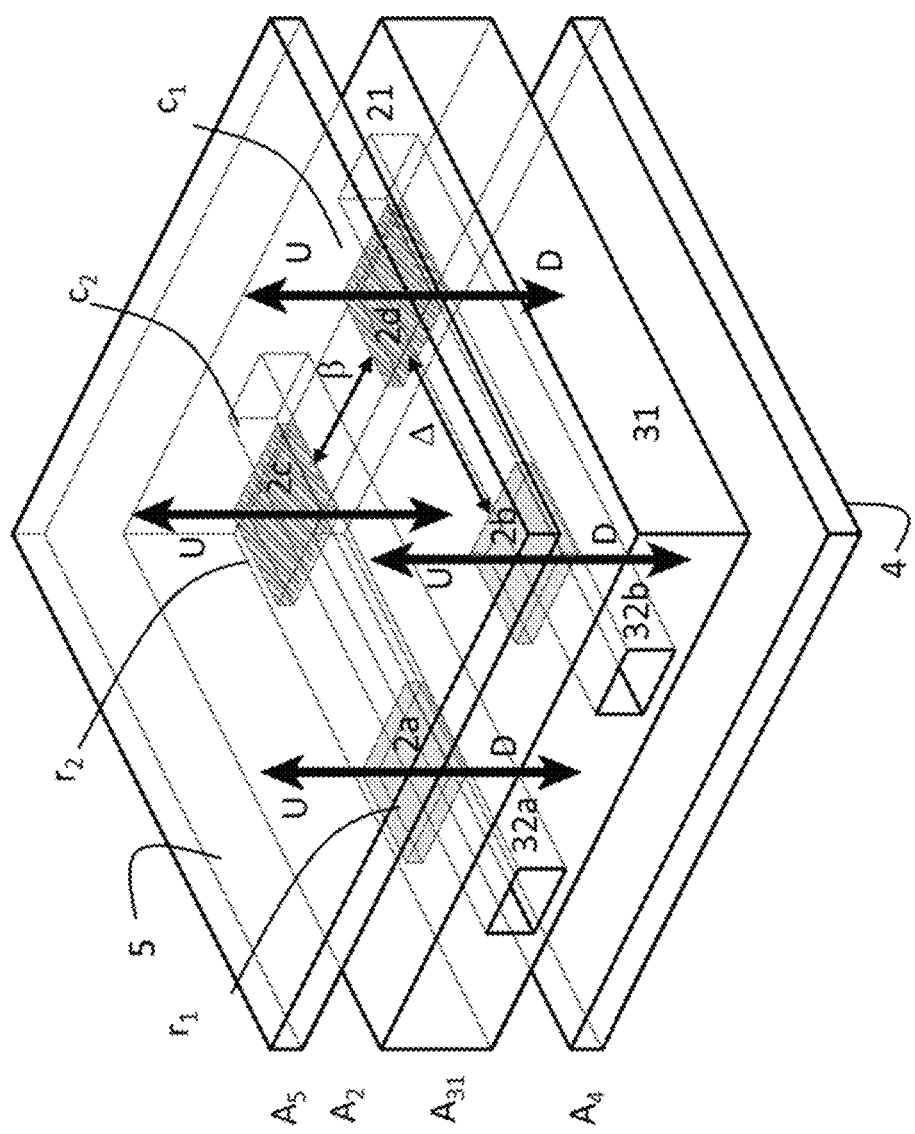
FIG. 2 is a perspective exploded view of an on-chip optical absorption sensor according to another aspect.

FIG. 2 is a perspective exploded view of an on-chip optical absorption sensor 110 according to another aspect.

Compared to the FIG. 1, the light emitting device 2 further comprises an array 21 of light emitting elements 2a, 2b, 2c, 2d being arranged in a light emitting layer $A_2$ which is substantially planar. The light emitting elements 2b and 2d are arranged in a column $c_1$, wherein the light emitting elements 2b and 2d are spaced apart by a distance being the distance from the edge of the light emitting element 2d which is facing the light emitting element 2b to the edge of the light emitting element 2d which is facing the light emitting element 2b. The column $c_1$ is parallel to and spaced apart at a constant distance from column $c_2$ comprising the light emitting elements 2a and 2c. The distance β extends from the edge of the light emitting element 2c which is facing the light emitting element 2d to the edge of the light emitting element 2d which is facing the light emitting element 2c.

The distances β and Δ may vary independently between approximately 5 μm and 5 mm, optionally between approximately 300 μm and 1 mm, and optionally between approximately 500 μm and 700 μm.

The array 21 of light emitting elements 2a, 2b, 2c hence comprises a column $c_1$ comprising two light emitting elements 2b and 2d and a column $c_2$ comprising two light emitting elements 2a and 2c. The columns $c_1$, $c_2$ are arranged so as to form two rows $r_2$, comprising two light emitting elements 2a and 2b in row $r_1$ and two light emitting elements 2c and 2d in row $r_2$.

The light emitting elements 2a, 2b, 2c, 2d each emit light $L_D$, $L_U$ into a first direction D and a second direction U. The light $L_D$ emitted in the first direction D passes at least partially through the volume of the sample chamber 31 which may comprise microfluidic channels 32a, 32b. The microfluidic channels 32a, 32b are arranged to form two columns being substantially parallel to the columns $c_1$, $c_2$ of light emitting elements 2a, 2b, 2c, 2d.

The array 21 of light emitting elements 2a, 2b, 2c is substantially rectangular being formed of substantially rectangular light emitting elements 2a, 2b, 2c, 2d. However, any form of light emitting element 2a, 2b, 2c, 2d and any array pattern may be chosen. For example the light emitting elements 2a, 2b, 2c, 2d could also have a circular shape and the pattern could for example have a circular arrangement of light emitting elements 2a, 2b, 2c, 2d placed, for example equidistant, around a center.

Figure 3:
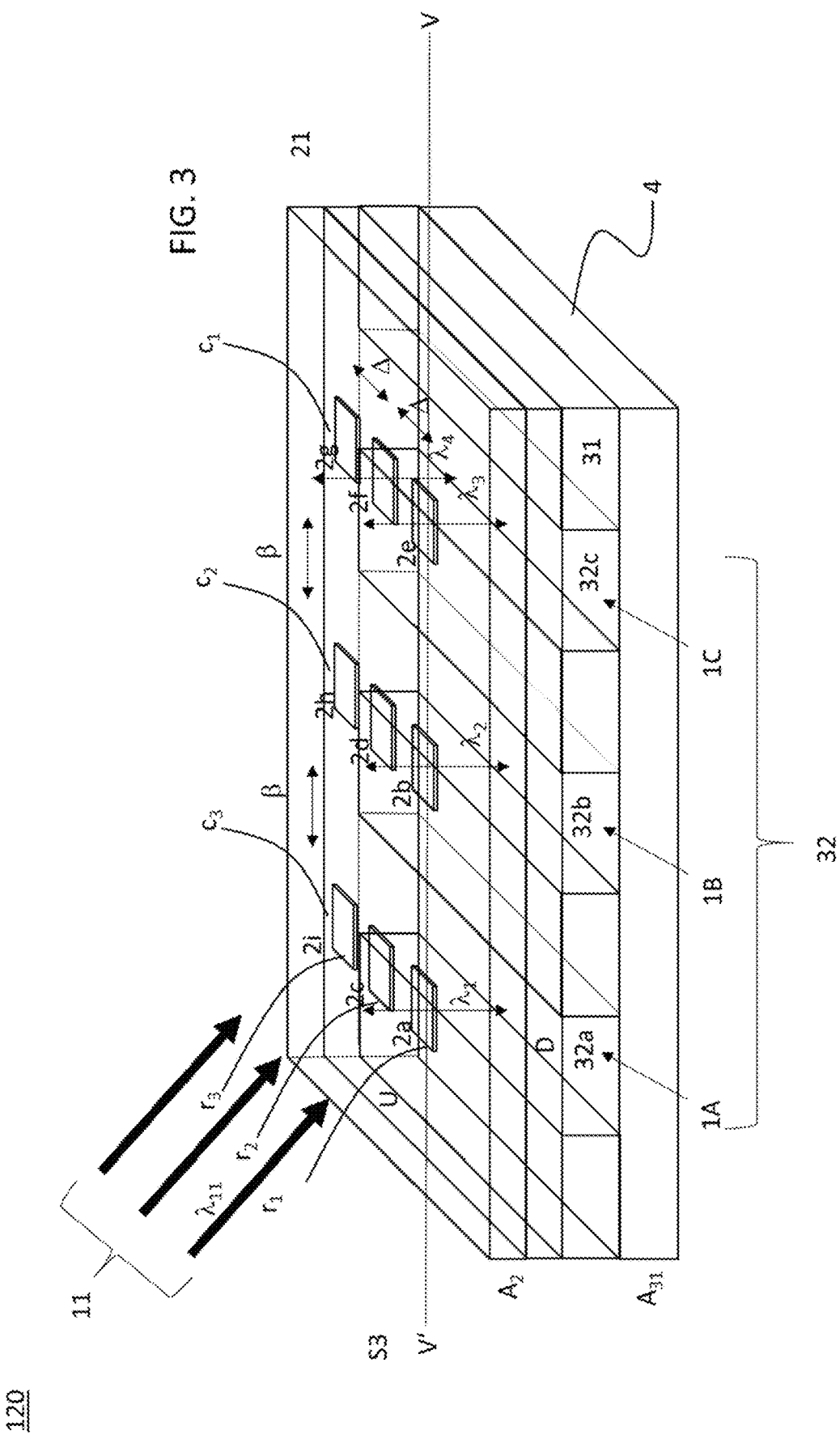
FIG. 3 is a perspective view of an on-chip optical absorption sensor according to another aspect, wherein the second light detector is not displayed.

FIG. 3 is a perspective exploded view of an on-chip optical absorption sensor according to another aspect. The on-chip optical absorption sensor 120 is configured in a sandwich structure S3, which will be described in following.

The distances β and Δ between two light emitting elements 2a-2i may vary independently as described above for FIG. 2. Particularly, the light emitting elements in one row $r_1$, $r_2$, $r_3$ may be positioned in a non-equidistant configuration. Similarly, the light emitting elements in one row $c_1$, $c_2$, $c_3$ may also be positioned in a non-equidistant configuration. It may also be possible that all light emitting elements 2a-2i are positioned at random locations with random edge to edge distances β and Δ to the next neighbors.

The second light detector 5 of the sandwich structure S3 is not shown in FIG. 3 but is part of the structure S3. Compared to the device shown in FIG. 2, FIG. 3 describes a 3×3 array 21 of nine light emitting elements 2a, 2b, 2c, 2d, 2e, 2f, 2g, 2h, 2i. The nine light emitting elements 2a, 2b, 2c, 2d, 2e, 2f, 2g, 2h, 2i are arranged in three columns $c_2$, $c_3$ forming three rows $r_1$, $r_2$, $r_3$, all being arranged in a light emitting layer $A_2$.

Each light emitting element 2a, 2b, 2c, 2d, 2e, 2f, 2g, 2h, 2i may emit light $L_D$ $L_U$ at an individual wavelength, i.e., for example light emitting element 2a emits light at a wavelength $\lambda_1$, light emitting element 2b emits light at a wavelength $\lambda_2$, light emitting element 2c emits light at a wavelength $\lambda_3$ and so on, wherein $\lambda_1$, $\lambda_2$ and $\lambda_3$ are different from each other.

The sample chamber 31 comprises a microfluidic channel structure 32. The microfluidic channel structure 32 comprises three microfluidic channels 32a, 32b, 32c which are each substantially in line with and parallel to one of the columns $c_1$, $c_2$, $c_3$ and arranged substantially in a sample chamber layer $A_{31}$. Each of the microfluidic channels 32a, 32b, 32c may host a sample 1A, 1B, 1C. If the wavelength for each column differs from the wavelength of the other columns, concentrations of different specimens can be measured along each column. In addition, the microfluidic channels 32a, 32b, 32c may host different samples 1A, 1B, 1C on one on-chip optical absorption device 120.

The on-chip optical absorption sensor 120 may hence be applied for multiplexed point-of-care testing.

The light emitting elements 2a, 2b, 2c, 2d, 2e, 2f, 2g, 2h, 2i are excited by means of a pump radiation 11 having a wavelength $\lambda_{11}$ or a wavelength range $\Delta\lambda_{11}$. The wavelength range $\Delta\lambda_{11}$ or the different wavelengths may be in a range in which the laser materials of the light emitting elements 2a, 2b, 2c, 2d, 2e, 2f, 2g, 2h, 2i absorb light and can be excited to emit light $L_D$, $L_U$.

The light $L_D$ being emitted in the first direction propagates at least partially through the chamber volume of the microfluidic channels 32a, 32b, 32c. If one or more samples 1A, 1B, 1C are provided inside the microfluidic channels 32a, 32b, 32c, the light $L_D$ might be attenuated due to the interaction between the light $L_D$ and the specimen contained in the samples 1A, 1B, 1C. At least a portion $L_{14}$ of the propagated light $L_p$ reaches the first detector 4 after having propagated through the samples 1A, 1B, 1C. The intensity I of the incoming light $L_{14}$ at the first detector 4 is detected.

In other words and comprising exemplary aspects, the on-chip optical absorption sensor 120 may comprise an organic laser array of light emitting elements 2a-2i with different laser wavelengths $\lambda_1$, $\lambda_2$, $\lambda_3$ etc., wherein an organic laser array of light emitting elements 2a-2i comprises columns $c_1$, $c_2$, $c_3$ which are positioned over columns 32a, 32b, 32c of a microfluidic channel structure 32. The light $L_D$ emitted by the light emitting elements 2a, 2b, 2c in the first direction D propagates at least partially through the samples 1A, 1B, 1C inside the microfluidic channels or columns $c_1$, $c_2$, $c_3$, respectively. In order to determine the absorption of a particular specimen/analyte, the intensity I of the laser light $L_D$ is detected by the first detector 4 which may be a detector array.

The light emitting device 2 may be an organic laser array as indicated in FIG. 3, particularly, a second order Distributed Feedback (DFB) laser architecture. The laser wavelength $\lambda_1$, $\lambda_2$, $\lambda_3$ etc. can be tailored by the choice of a lattice periodicity Λ of a DFB grating 22 (not shown in FIG. 3) in the light emitting elements 2a-2i of the array 21 of light emitting elements 2a, 2b, 2c etc. Each light emitting element 2a-2i is coated with the organic laser material. Organic laser materials typically absorb pump light 11 at wavelengths $\lambda_{11}$ in the ultraviolet spectral range (UV) and emit their luminescence as light with wavelengths $\lambda_1$, $\lambda_2$, $\lambda_3$ in the visible spectrum. Any of the variety of organic laser materials with light emission in the entire visible spectral range may be considered. The pump laser may for example emit very short laser pulses in the nanosecond regime.

In the following an exemplary light emitting element 2a is described in further detail.

Figure 4:
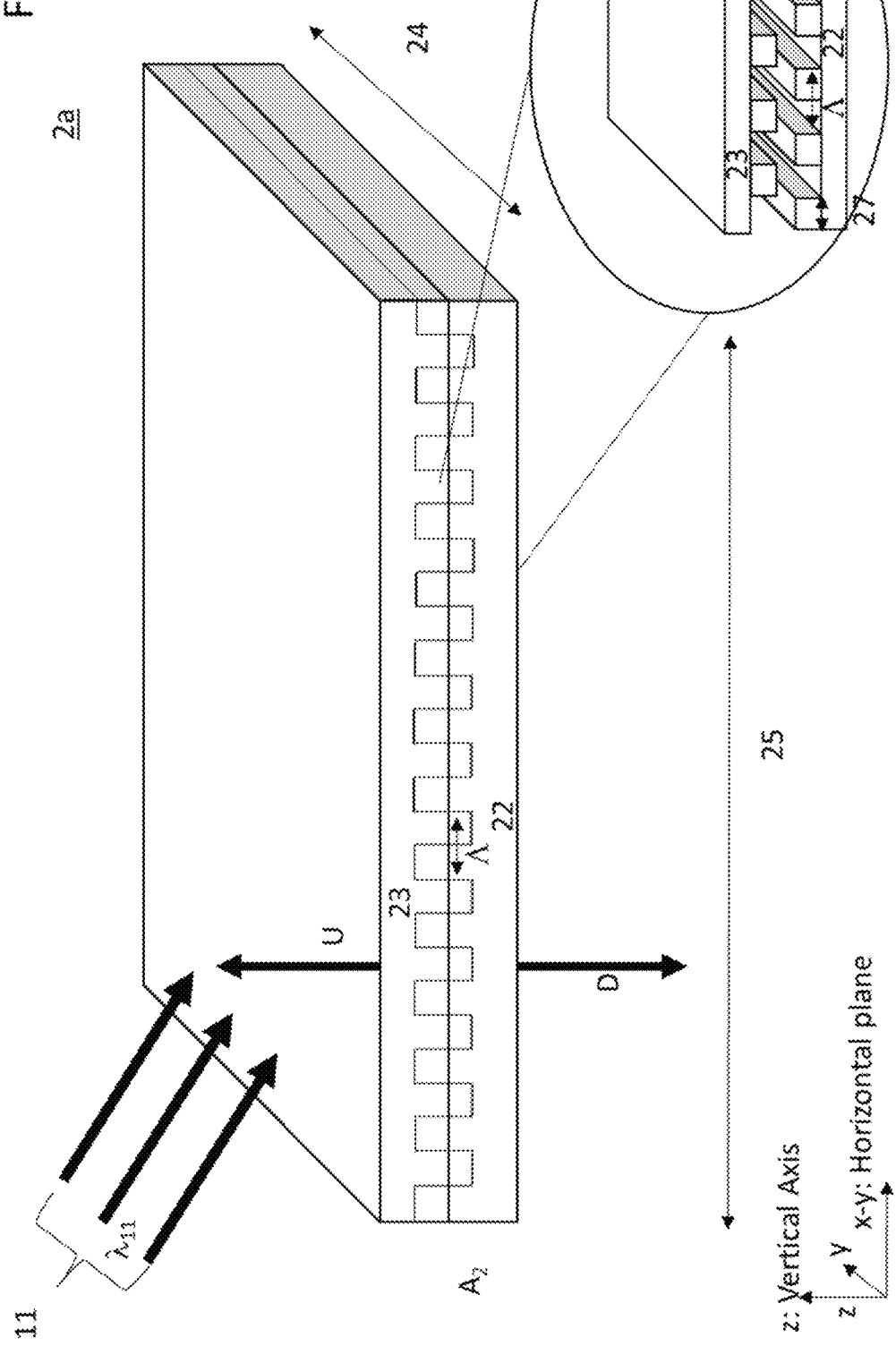

FIG. 4a is a front view of an exemplary light emitting element 2a for example of an array 21 of light emitting elements 2a, 2b, 2c etc. of a light emitting device 2, as shown in FIG. 3. The light emitting element 2a comprises an overlayer of an organic laser material 23 and an underlayer of a DFB grating 22 which is configured as a lattice. The DFB grating 22 has a grating constant Λ. Within this description, the grating constant may be understood as the periodic length of the grating structure, i.e. the combined width of a line and a space in the periodic sequence of lines and spaces. In other words, the granting constant may be understood as the sum of the width of single line and single space.

The laser emission wavelength may be tailored by the choice of organic laser material 23 and geometric properties, particularly the grating constant Λ of the grating structure 22. It is possible to generate laser light throughout the visible spectrum by varying these parameters. The grating constant Λ may be varied between approximately 3 µm and 3 nm, optionally between approximately 1.5 µm and 150 nm and optionally approximately 300 nm to 700 nm. The method for manufacturing a light emitting device 2 with a DFB grating 22 is described in DE 10 2017 011 726 A1, the disclosure of which is incorporated herein in its entirety.

Organic laser materials often absorb pump light in the ultraviolet spectral range (UV) while emitting a luminescence and a stimulated emission in the visible spectrum. There are plenty of organic laser materials covering light emission wavelengths in the entire visible spectral range.

The laser emission wavelength of a grating 22 as described above may be tuned between approximately 450 nm and 700 nm, optionally between approximately 500 nm and 590 nm, for example approximately 540 nm.

A light emitting element 2a may have a length 25 and a width 24, wherein the length 25 and the width 24 may independently vary between approximately 50 µm and 10 mm, optionally between approximately 500 µm and 5 mm, optionally between approximately 800 µm and 1 mm. An array 21 of light emitting element 2a-2i as displayed in FIG. 3 may comprise light emitting element 2a-2i with different sizes, i.e., wherein the length 25 and/or the width 24 of at least two or of each of the light emitting elements 2a-2i differ from another.

A light emitting element 2a may also have a larger size compared to the one described above. For example, a light emitting element 2a may have a length 25 and a width 24 independently varying between approximately 1 cm and 5 cm, optionally between approximately 2 cm and 3 cm.

A light emitting device 2 may for example comprise only approximately one to 9 light emitting elements 2a, 2a, 2b, etc. Optionally, a light emitting device 2 may comprise between approximately 50 and 1000 light emitting elements 2a, 2a, 2b, etc.

FIG. 4b is a front exploded view of a portion of the light emitting element 2a of FIG. 4a. Particularly, the DFB grating 22 with a grating constant Λ is illustrated with an overlayer of an organic laser material 23 in an exploded view, for better understanding of the grating structure 22. The grating structure 22 may comprise rectangular projections or teeth each having a length 26 and a width 27. The length 26 of the grating structure 22 may correspond with the width 24 of a light emitting element 2a. The width 27 of the grating structure 22 may be homogeneous or varying throughout a light emitting element 2a. The width 27 of the grating structure 22 is determined by the grating constant Λ.

Figure 5:
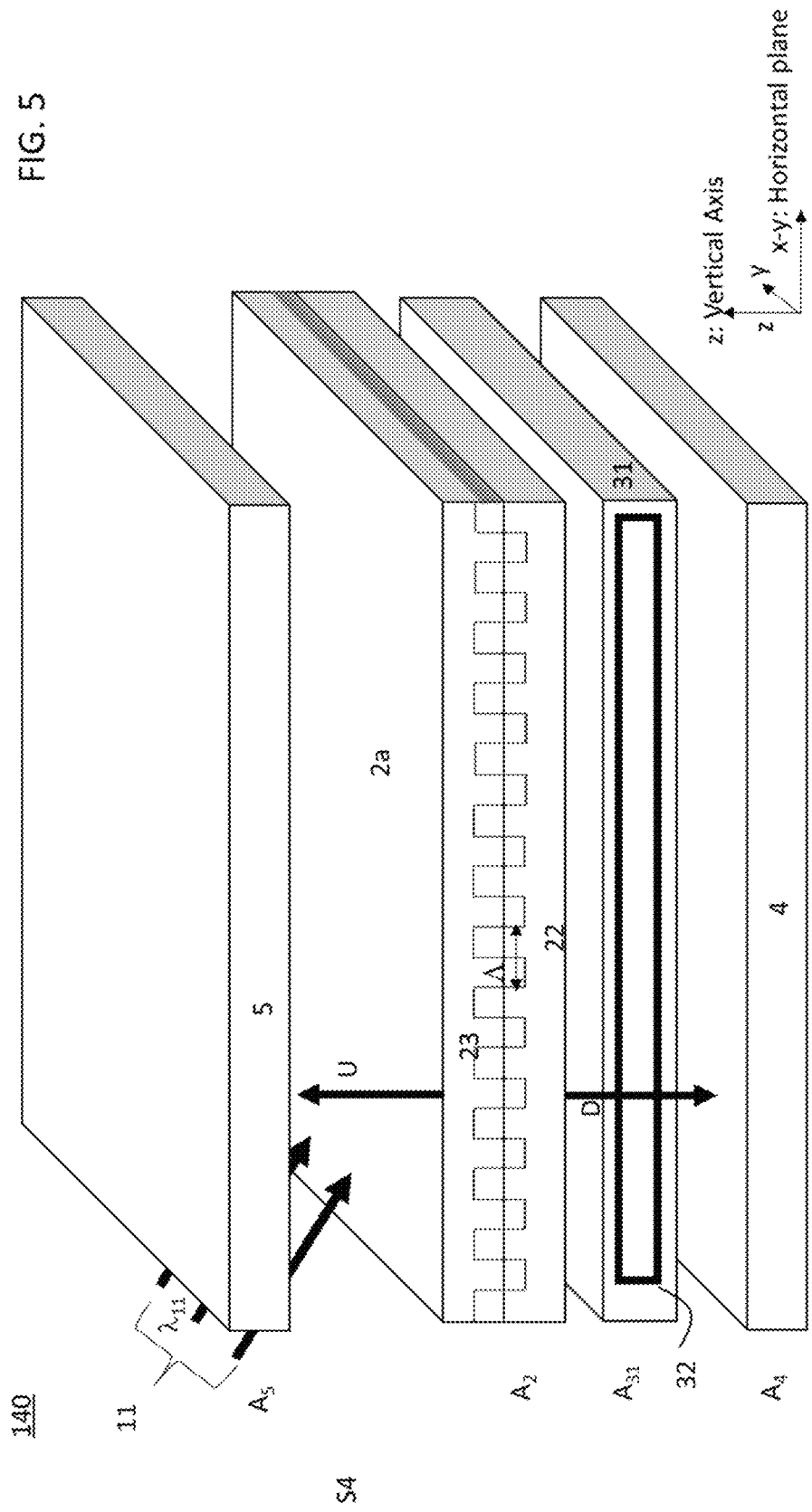

FIG. 5 is a front exploded view of a portion 140 of an on-chip optical absorption sensor comprising the light emitting element 2a of FIG. 4a. The sandwich structure S4 shown in FIG. 5 may be a cut out of the sandwich structure S3 of the on-chip optical absorption sensor 120 of FIG. 3. The cut out may be along the cross section line VV' of a single light emitting element 2a as indicated in FIG. 3.

Alternatively, the sandwich structure S4 shown in FIG. 5 may also be considered a complete on-chip optical absorption sensor 140, if the light emitting device does not comprise an array of light emitting elements 2a, 2b, 2c, etc. but only one single light emitting element 2a.

Figure 6:
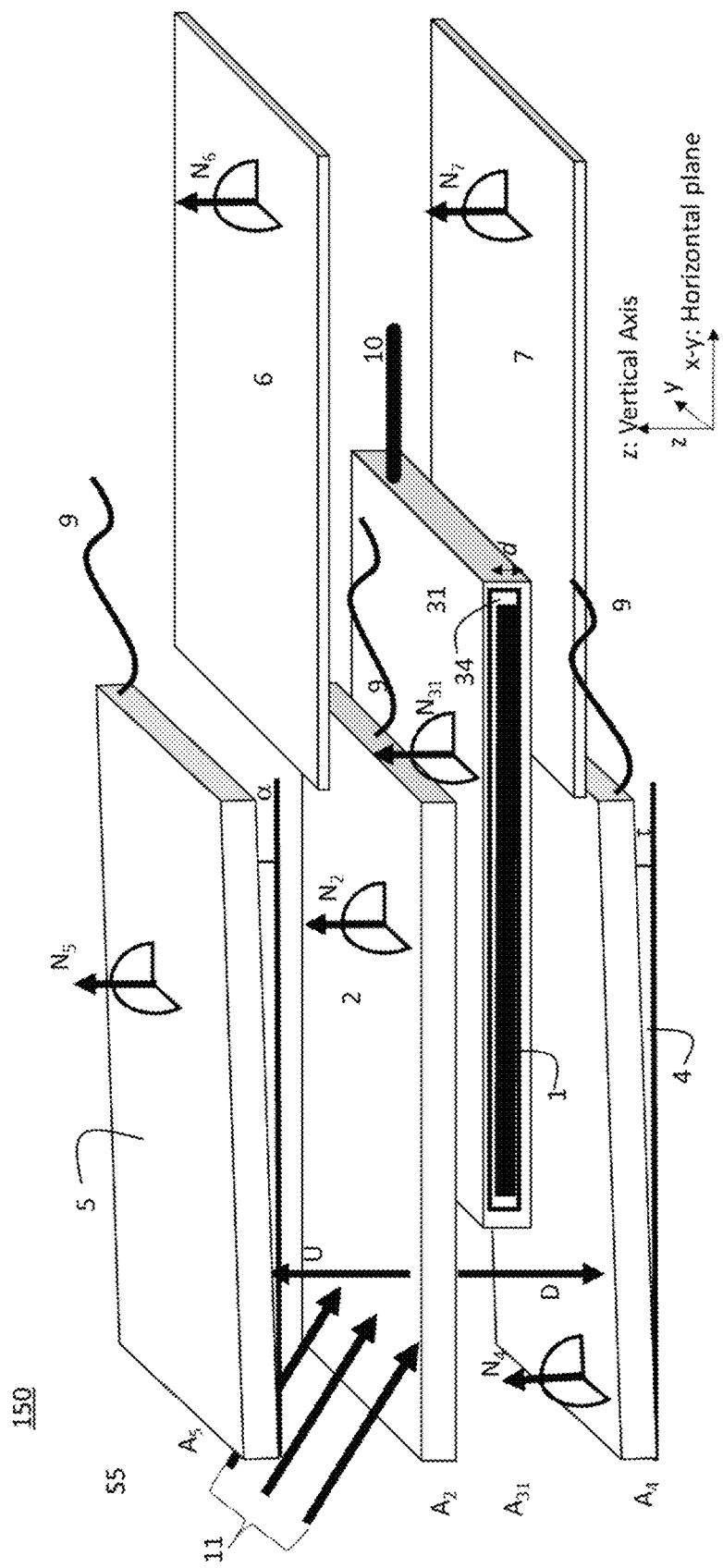
FIG. 6 is a front exploded view of an on-chip optical absorption sensor according to another aspect.

FIG. 6 is a front exploded view of an on-chip optical absorption sensor 150 according to another aspect. The sandwich structure S5 displayed in FIG. 6 will be described the following.

The difference between the sandwich structure S5 of FIG. 6 and S1 of FIG. 1 are tilted light detector layers $A_4$, $A_5$. In other words, the normal directions $N_4$, $N_5$, of the light detector layers $A_4$, $A_5$ are not parallel to the first direction D and second direction U and the vertical axis z. The light detector layers $A_4$, $A_5$ are tilted at angles $\alpha$, $\tau$ for example with respect to the light emitting layer $A_2$ and the horizontal direction y of FIG. 6. In other words, the light $L_D$, $L_U$ being emitted from the light emitting device 2 along the directions D and U does generally not impinge on the light detector layers $A_4$, $A_5$ at an angle of 90°. As a result of this configuration, multiple reflections between the surfaces of the light detector layers $A_4$, $A_5$ and the light emitting layer $A_2$ may be avoided. The angles $\pi$, $\tau$ may differ from each other, as optical elements and/or a sample chamber 31 and/or a sample 1 may deviate or change the direction of the light $L_D$ in the first direction D, whereas the light $L_U$ emitted in the second direction will generally not deviate or change direction or at a different angle.

The angles $\alpha$, $\tau$ may for example be between approximately 0.2° and 7°, optionally between approximately 0.5° and 5°, more optionally between approximately 1° and 4°.

Figure 7:
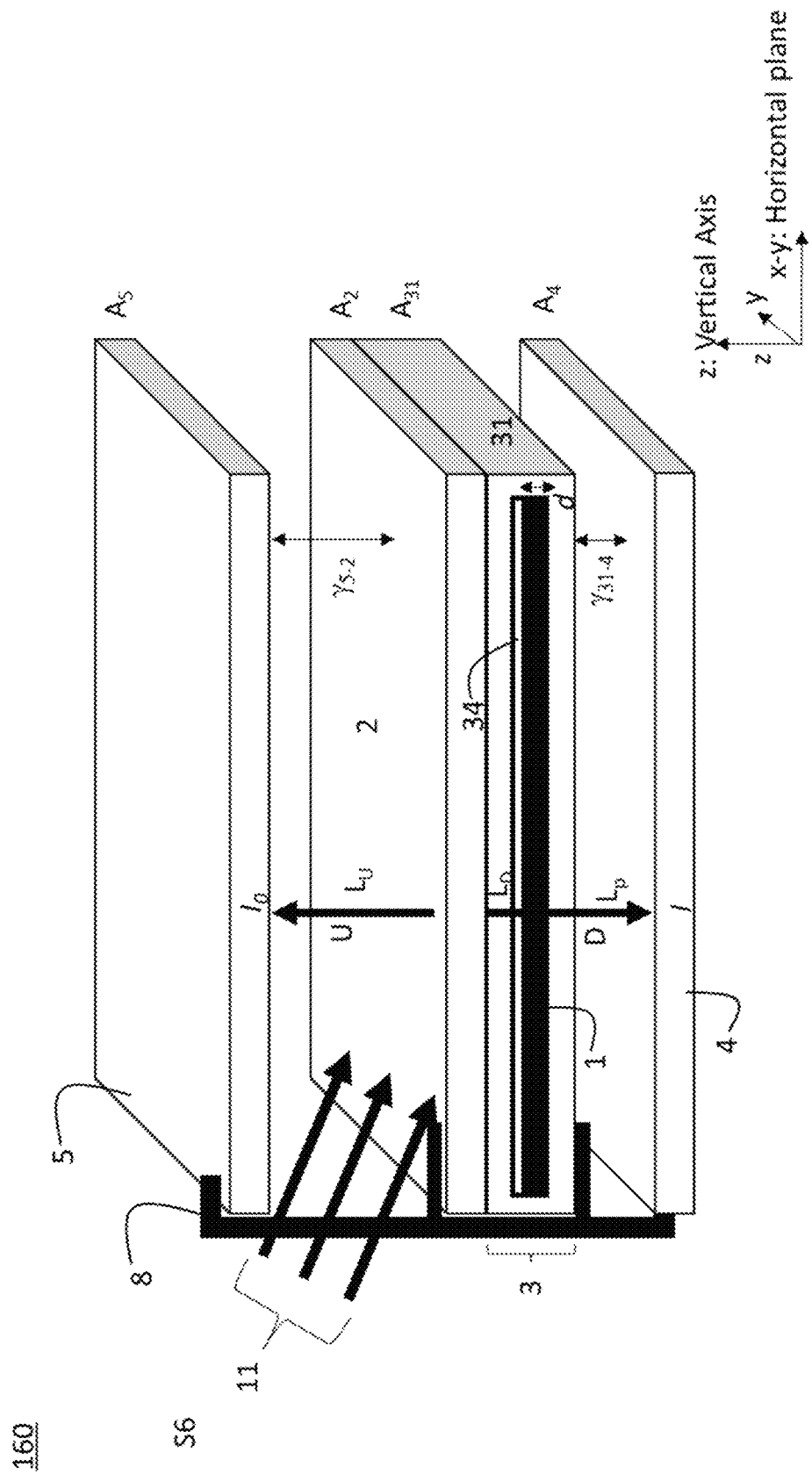
FIG. 7 is a front exploded view of an on-chip optical absorption sensor according to another aspect.

FIG. 7 is a front exploded view of an on-chip optical absorption sensor 160 according to another aspect. The difference between the sandwich structure S6 of FIG. 7 and S1 of FIG. 1 is the light emitting device 2 and the sample chamber 31 being integrally formed with each other in the present sandwich structure S6. In other words, the sample chamber 31 is connected to the light emitting device 2 in such a way that they cannot be separated from each other. In FIG. 7, the light emitting layer $A_2$ and the sample chamber layer $A_{31}$ are not spaced apart by a substantial distance from each other. However, a spacer may be included to maintain a distance between the light emitting layer $A_2$ and the sample chamber layer $A_{31}$.

The light emitting device 2 may degrade after a short time period due to organic lasing material having only a short lifetime in the operation mode. Similarly, it may be required that a sample chamber 31 may only be used a single time, as for example a cleaning procedure would be too complicated and time consuming to ensure that a sample 1 is not contaminated with specimens of a previously used sample 1. If the lifetime of a light emitting device 2 and the lifetime of a sample chamber 31 are both approximately in the range of an operation time of a single use, it may be advantageous to provide the light emitting device 2 and the sample chamber 31 as integrally formed single use elements. The sandwich structure S6 of may be configured such that the light detectors 4, 5 are for permanent use, for example permanently attached to the mount 8, and the unit of the sample chamber 31 being connected to the light emitting device 2 may be replaced like a cassette before every new measurement. At least one filter 6, 7 may be included in the sandwich structure S6 for permanent and/or multiple and/or single use. At least one filter element may also be integrally formed with the light emitting device 2 and/or the sample chamber 31.

Alternatively, the entire sandwich structure S6 may be configured for single use. Hence, all elements, such as at least the light detectors 4, 5, the light emitting device 2 and the sample chamber 31 may be integrally formed with each other and configured for single use.

Alternatively, the entire sandwich structure S6 may be configured for permanent or at least for multiple use while at least two elements are integrally formed with each other. It may for example be practical to produce the light emitting device 2 and the sample chamber 31 as a single piece by means of producing a multilayer including 3D printing or layer-by-layer generation ((spin) coating, laminating, etc.).

Figure 8:
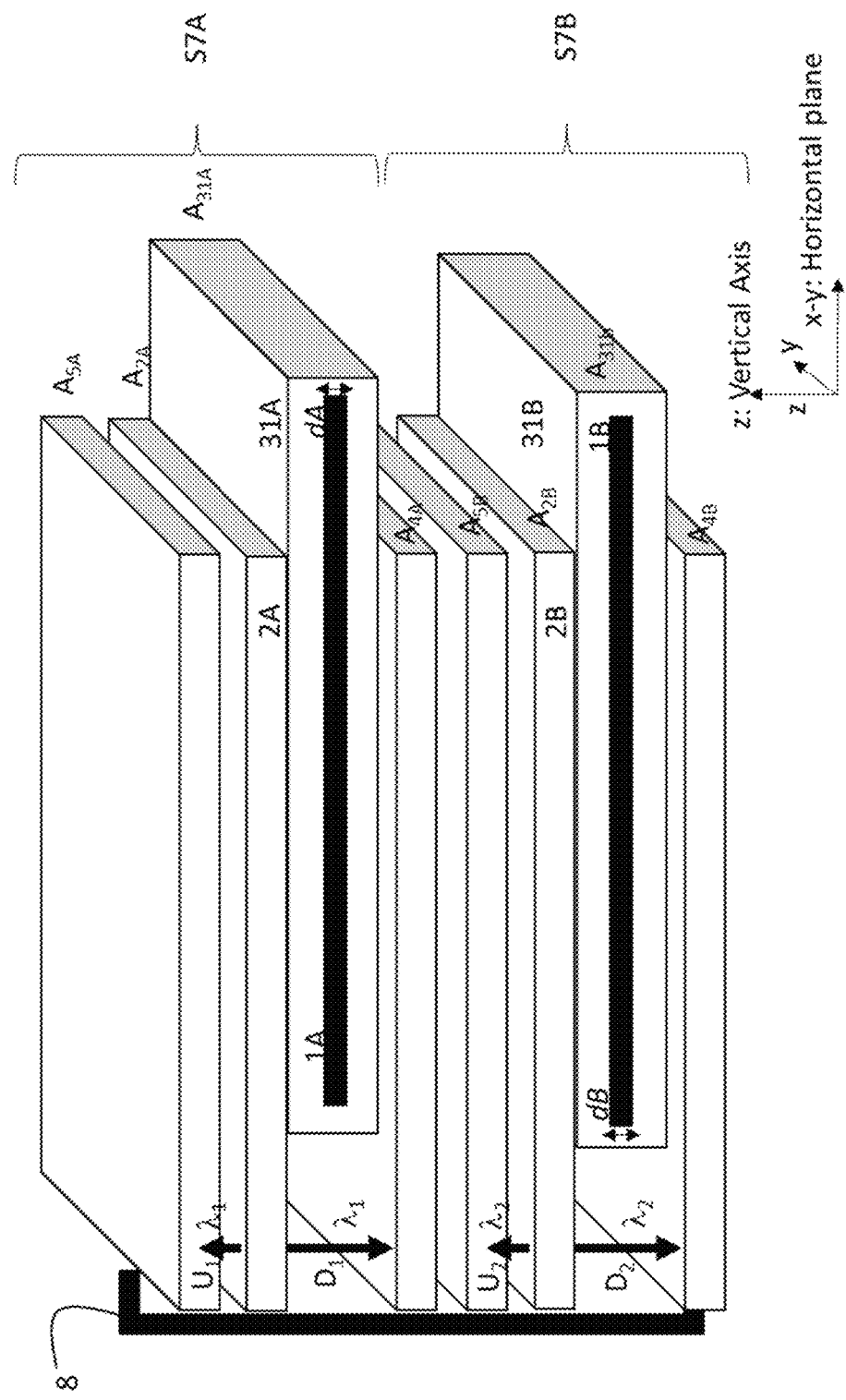
FIG. 8 is a front exploded view of an on-chip optical absorption sensor according to another aspect.

FIG. 8 is a front exploded view of an on-chip optical absorption sensor 170 according to another aspect. The sandwich structures S7A and S7B each refer substantially to the sandwich structure S1 of FIG. 1. Each sandwich structures S7A and S7B can be considered a sandwich structure unit. Optional filter elements 6, 7 are not illustrated in FIG. 8. The two sandwich structure units S7A and S7B are combined to form a sandwich structure S7 hence comprising two units.

Similarly, as in the case of FIG. 3, where different microfluidic channels 32a, 32b, 32c are provided, a sandwich structure having more than one unit may be very efficient, as different samples 1A, 1B may be investigated at the same time. The aspects of the sandwich structures S3 of FIG. 3 and S7 of FIG. 8 may optionally be combined.

The sandwich structure S7 may for example be configured to receive two samples 1A, 1B, of which the concentration of the same specimen should be determined at the same time. In that case, the light emitting devices 2A, 2B may emit light having the same wavelength $\lambda_1 = \lambda_2$.

Alternatively, the sandwich structure S7 may be configured to receive two identical samples 1A, 1B, wherein the concentration of different specimens should be determined at the same time. In that case, the light emitting devices 2A, 2B may emit light having a different wavelength $\lambda_1 \neq \lambda_2$, as two different specimens absorb at different wavelengths due to their different molecular structures.

Alternatively, in a configuration in which aspects of the sandwich structure S3 are combined with aspects of the sandwich structure S7, at least two sandwich structures S7A, S7B including at least two light emitting devices 2A, 2B are provided, wherein each light emitting device 2A, 2B comprises light emitting elements 2a, 2b, 2c etc. as indicated in FIG. 3. These light emitting elements 2a, 2b, 2c etc. may emit light $L_D$, $L_U$ at wavelengths $\lambda_1$, $\lambda_2$, $\lambda_3$ which are different from each other, such that the concentration c of different specimens in one sample 1A in one sample chamber 31A of one sandwich structure S7A may be determined. At the same time, the concentration c of the same or other specimens of the same or of a different sample 1B may be determined in the other sample chamber 31B of the other sandwich structure S7B.

The sandwich structures S7A, S7B have substantially the same geometry in the on-chip optical absorption sensor 170. Alternatively, other geometries and configurations, as for example described herein, may be adopted in the present case.

The on-chip optical absorption sensor 170 may hence be applied for multiplexed point-of-care testing.

Figure 9:
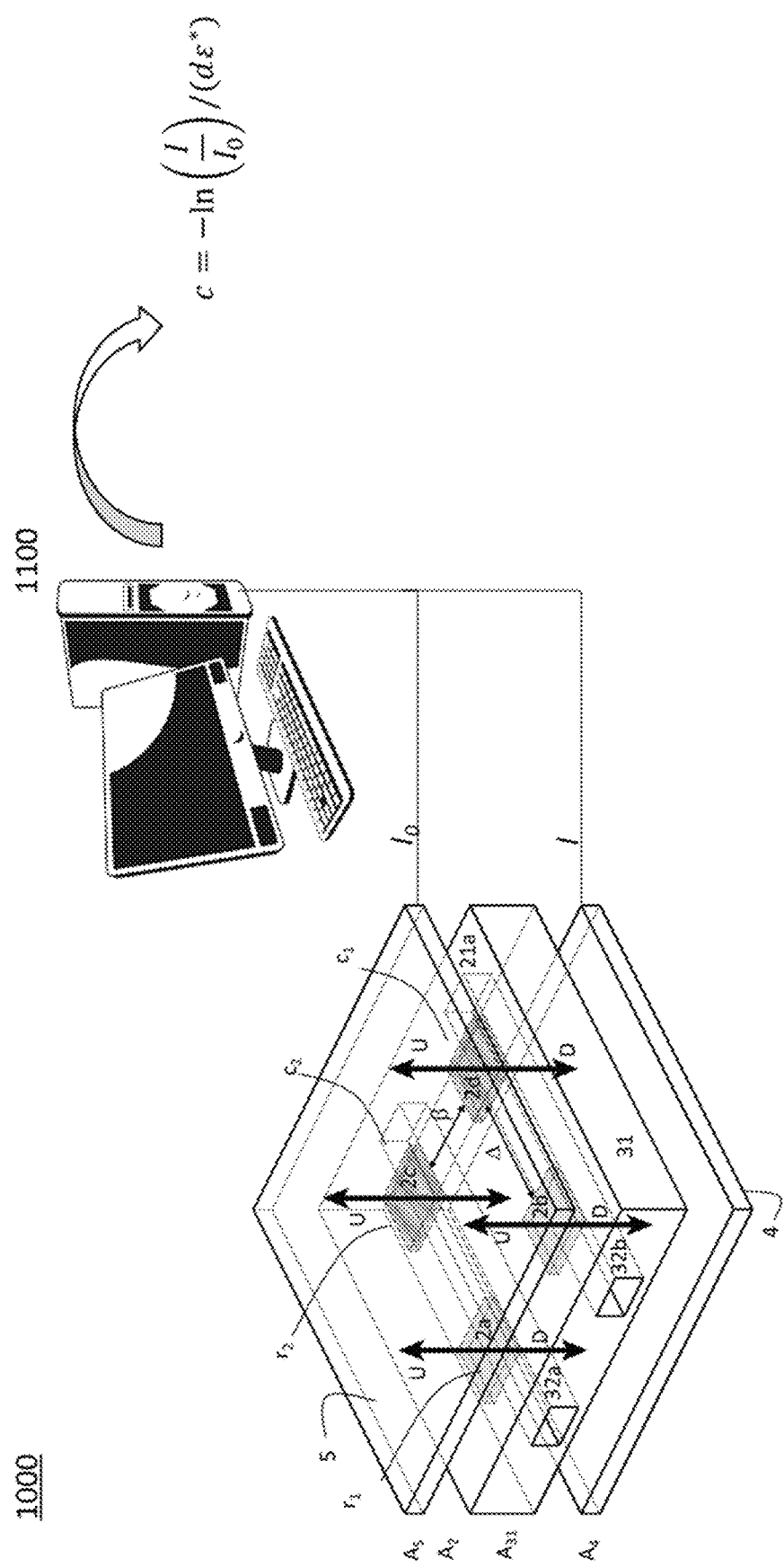
FIG. 9 is a schematic view of a system according to an aspect comprising an on-chip optical absorption sensor.

FIG. 9 is a schematic view of a system 1000 according to an aspect comprising an exemplary on-chip optical absorption sensor 110 according to FIG. 2 and a computer 1100. The computer 1100 is configured to receive data from the on-chip optical absorption sensor 110, particularly the intensities, I and $I_0$ to determine the concentration of one or more specimens in one or more samples.

The computer 1100 may comprise a computer program product which when loaded and run cause the computer to perform steps to determine the concentration of one or more specimens in one or more samples. The computer 1100 may cause the measurement to be started, the pump laser to emit pump radiation 11 to excite the laser to emit light $L_D$, $L_U$, to cause the light detectors 4, 5 to detect the intensities I and $I_0$ of the incident light $L_{14}$, $L_{15}$, to cause the light detectors 4, 5 to transmit the data related to the intensities I and $I_0$ and to cause the computer to calculate or determine the concentration of the one or more specimens in the one or more samples 1 according to:

$$c = -\ln\left(k_I \frac{I}{I_0}\right) / (d\varepsilon^*)$$

wherein 1 is an attenuated intensity of the propagated light $L_P$ detected by the first light detector 4, $I_0$ is a reference intensity of the light $L_U$ emitted in the second direction U detected by the second light detector 5, $\varepsilon^*$ is an extinction coefficient of the specimen at a wavelength $\lambda$ of the light, c is a molar concentration of the specimen in the sample 1, d is a thickness of the sample 1 in the first direction D and $k_I$ is a factor taking into account a the relation between the intensities $I_D$, $I_U$ of light $L_D$, $L_U$ being emitted into the first D and the second directions U, respectively, according to $$k_I = \frac{I_D}{I_U}.$$

The above operations may also be performed by more than one computer 1100. For example, the pump laser may be operated through an external system. The computer 1100 and the on-chip optical absorption sensor 110 may be a handheld device.

The term "computer" may herein refer to any unit which is configured to perform calculations, for example particularly a microcontroller, a processor, or the like.

Figure 10:
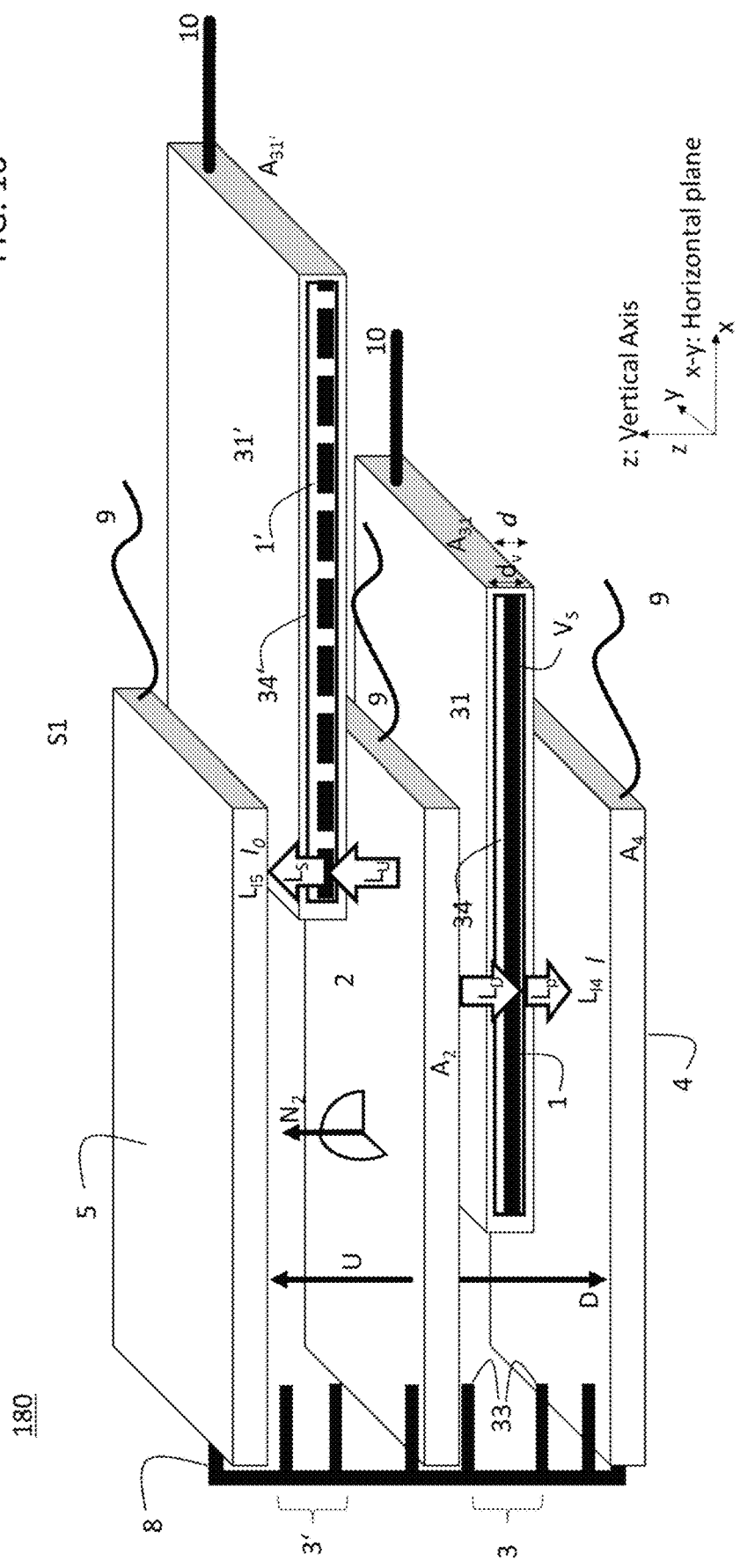
FIG. 10 is a front exploded view of an on-chip optical absorption sensor according to another aspect.

FIG. 10 is a front exploded view of an on-chip optical absorption sensor 180 according to another aspect. In the illustrated example, a reference holder 3' is provided between the light emitting device 2 and the second light detector 5. According to this aspect, also a reference chamber 31' can be positioned between the light emitting device 2 and the second light detector 5. The reference chamber 31' may be different from the sample chamber 31, however, according to a preferred aspect, the reference chamber 31' is substantially identical to the sample chamber 31, with respect to geometry, optical and physical properties and composition. The reference chamber 31' comprises a reference chamber volume 34', which is also preferably substantially identical in shape, particularly in thickness along the first direction D, with the chamber volume 34 of the sample chamber 31.

The reference chamber volume 34' may be filled at least partially with a reference substance 1', for example a solvent that is also present in the sample 1 for example for dissolving or dispersing the specimen. Hence, the reference measurement, i.e. the measurement of $I_0$, may already take into account attenuation effects. Such attenuation effects may origin from the material from which the sample chamber 31 and the reference chamber 31' is made of, reflections on the surfaces of the sample chamber 31 and the reference chamber 31', the solvent absorbance and/or scatter effects of the solvent. Basically, the extinction of the solvent and/or the sample chamber 31 and potentially other optical attenuation effects arising (and not originating from the specimen), may be determined and substantially isolated from the pure extinction of the specimen.

Instead of a sample chamber 31 and a reference chamber 31', a sample 1 and a reference substance 1' may also be supported by microscope slides.

Further, filter elements, which are not shown in FIG. 10, may be added at any one or two positions between the light emitting device 2 and the first 4 and/or second light detector 5 to avoid that the first 4 and/or the second 5 detectors are exposed to the pump radiation 11. However, a sample chamber 31 and a reference chamber 31' and/or a sample 1 and/or a reference substance 1' may also substantially filter pump radiation 11, particularly in the UV or near-UV region.

The light emitting device 2 may be formed integrally with either one or both of the sample chamber 31 and a reference chamber 31'. In general, all aspects which apply to the sample chamber 31 may also apply to the reference chamber 31'.

The empty reference chamber 31' and the empty sample chamber 31 may be positioned inside the on-chip optical absorption sensor 180 during a calibration measurement as described above. However, at least one of the reference chamber 31' or the sample chamber 31 may also be removed from the on-chip optical absorption sensor 180 during a calibration measurement.

Point-of-care testing (POCT) may provide a diagnostic test at or near the time and place a patient is admitted. POCT uses a concentration of an specimen/analyte to provide the user with information on the physiological state of the patient and/or a biological system and/or an ecosystem. An analyte, for example a marker, is a chemical or biological specimen, which is analyzed using a certain instrument such as a spectrometer or an on-chip optical absorption sensor as described herein. While point-of-care testing is the quantification of one single analyte from one in vitro (e.g. blood, plasma or urine) sample, multiplexed point-of-care testing is the simultaneous on-site quantification of various analytes from a single sample. Multiplexed point-of-care testing (xPOCT) is hence a more complex form of point-of-care testing (POCT), or bedside testing.

Processing of one biological sample to yield multiple biomarker results allows for POCT testing to be done for patients who may have conditions that require the confirmation of multiple biomarkers and tests before diagnosis (e.g. many types of cancers). xPOCT has important emerging applications in resource-limited settings, (e.g. in the developing countries, in doctor's practices, or at home by non-experts) xPOCT has recently become more important for in vitro diagnostics.

The term "array" affiliated with the reference numeral 21 generally refers herein to the array comprising columns and rows of light emitting elements 2a, 2b, 2c, etc.

The term "grating structure" affiliated with the reference numeral 22 generally refers herein to a structure or lattice characterized by the grating constant Λ. The term "grating structure" is not to be confused with the "array".

A concentration of a specimen may be derived directly from a measured (attenuated) intensity of a native sample according to the Lambert Beer law. Alternatively, it may be required to add a marker or a reagent into the sample which substantially reacts with the at least a portion of the specimen in the sample. The result of this reaction may then be detected as an (attenuated) intensity and may hence act as an indicator for the concentration of the specimen.

In the following, some definitions which are used herein are given.

A specimen, i.e., analyte, may be a compound, for example a certain type of molecule. A sample may be biological and/or chemical substance which may comprise several specimens. The sample may comprise a mix of molecules, such as for example proteins, water, lipids and ions. The sample may for example be a sample of blood, a sample of waste water or a sample of foods.

Particularly, a period of time required for a single measurement is between approximately 0.5 s and 20 minutes, particularly between approximately 3 s and 30 s, more particularly between approximately 5 s and 10 s.

Pump lasers may be for example UV-lasers or UV near lasers, i.e. lasers which emit the pump light in a wavelength region overlapping the UV region. Ultraviolet (UV) light may in general have a wavelength between approximately 10 and 400 nm. The pump light may have a wavelength in this range, particularly the pump light also includes wavelengths near the UV region (near-UV region). Preferably, the pump radiation comprises light with wavelengths between approximately 350 nm and 490 nm. It is important to choose a wavelength range at which a certain power can be reached to achieve the stimulated emission in the organic laser. Particularly, Blue-Ray Laser-Diodes preferably emitting light at a wavelength around approximately 405 nm may be used. Pump lasers may also be pulsed lasers.

Organic laser materials may comprise for example the following dyes: ADS233YE, ADS100RE, ADS133YE, ADS232GE, ADS145UV.

At least some of the widths of the layers particularly range around approximately 10 mm to 300 mm. At least some of the lengths of the layers particularly range around approximately 10 mm to 300 mm. The thickness defined by the distance between the upper surface of the upper most layer to the lower surface of the lower most layer (for example from first to second light detector) in the first/second directions may range around approximately 1 mm and 30 mm. The thickness also depends on the number of layers used in the sandwich structure and/or the number of sandwich units used in a combined sandwich structure. As an example, the size of an on-chip optical absorption sensor is approximately 76 mm×26 mm×5 mm.

Particularly, the weight of an on-chip optical absorption sensor is between approximately 3 g and 100 g, particularly between approximately 10 g and 50 g, and more particularly between approximately 20 g and 30 g, such as for example approximately 25 g.

The sample chamber 31 and/or the reference chamber 31' may comprise at least any one of: glass, Zink Selenide, Calcium Fluoride, Sapphire, BK7 glass, Silicon (n- or p-type), a polymer and/or an organic compound, for example a UV absorption organic layer over the surface.

A light emitting device, as far as it is not configured to emit coherent light, might for example be a flexible LED panel, a fiber optic or any light source that can emit light, particularly monochromatic and which can be provided as a thin layer. Even some laser systems, such as organic-based microcavity lasers, may emit light which is not considered coherent light herein (described in more detail, as follows).

Particularly, coherent light is considered coherent in terms of spatial and temporal coherency, i.e. substantially monochromatic light with wave trains having substantially parallel wave fronts. Herein, coherent light is considered coherent when the coherence length of the light is exceeding a range between approximately 1 cm to approximately 10 cm, particularly when the coherence length of the light is exceeding approximately 1 m and even more particularly when the coherence length of the light is exceeding approximately 100 m.

Particularly, light which has a coherence length of less than 1 cm may be considered non-coherent, i.e. not coherent, herein.

For comparison, multimode helium-neon lasers typically have a coherence length of approximately 20 cm, while the coherence length of single-mode lasers can exceed approximately 100 m. Semiconductor lasers can reach approximately some 100 m, but small, inexpensive semiconductor lasers have shorter lengths, such as for example approximately 20 cm. Single mode fiber lasers with linewidths of a few kHz can have coherence lengths exceeding 100 km. For example, the spatial coherence length of an europium complex-based OLED may be in the µm range, it may range for example between approximately 1.7 µm to 1.9 µm.

All examples and aspects described herein may be realized with a coherent and a non-coherent light emitting device. A coherent light emitting device emits substantially coherent light and a non-coherent light emitting device emits substantially non-coherent light.

There are cases, in which lasers emit non-coherent light in the sense of the above definition. For example, some free running diode lasers may have a coherence length of less than 1 mm. Organic-based microcavity lasers may for example have a coherence length in the µm range, such as for example approximately 45 µm (Camposeo, Andrea & Persano, Luana & Del Carro, Pompilio & Papazoglou, Dimitris & Stassinopoulos, Andreas & Anglos, Demetrios & Pisignano, Dario. (2008). Longitudinal coherence of organic-based microcavity lasers. Optics express. 16. 10384-9. 10.1364/OE.16.010384.).

REFERENCE SIGNS

| | |
|---|---|
| 1; 1A; 1B; 1C | Sample |
| 1' | Reference substance |
| 2; 2A, 2B | (Coherent) light emitting device |
| 2a, 2b, 2c, 2d; 2e, 2f, 2g, 2h, 2i | (Coherent) light emitting elements arranged in at least a column and two rows |
| 3 | Sample holder |
| 3' | Reference holder |
| 4 | First light detector |
| 5 | Second light detector |
| 6 | (first) Filter element |
| 7 | (second) Filter element |
| 8 | Mount |
| 9 | Cable for data transfer and/or energy supply |
| 10 | Port for filling the volume of the sample chamber with a sample |
| 11 | Pump radiation of a pump laser |
| 21 | Array of (coherent) light emitting elements having at least one column and at least two rows |
| 22 | (DFB) grating or grating structure |
| 23 | Organic laser material |
| 24 | Width of a grating |
| 25 | Length of a grating |
| 31; 31A, 31B | Sample chamber |
| 31' | Reference chamber |
| 32 | Microfluidic channel structure |
| 32a, 32b; 32c | Microfluidic channel |
| 33 | Holding elements for holding the sample or the sample chamber |
| 34 | Chamber volume in sample chamber |
| 34' | Reference chamber volume |
| 100; 110; 120; 140; 150; 160; 170; 180 | Embodiments of on-chip optical absorption sensors |
| 1000 | System comprising an on-chip optical absorption sensor and a computer |
| 1100 | Computer |
| α | Angle between second light detection layer and (parallel of) light emitting layer in one dimension |
| $A_2$; $A_{2A}$; $A_{2B}$ | Light emitting layer |
| $A_{31}$; $A_{31A}$; $A_{31B}$ | Sample chamber layer |
| $A_{31'}$ | Reference chamber layer |
| $A_4$, $A_{4A}$, $A_{4B}$ | First light detection layer |
| $A_5$; $A_{5A}$; $A_{5B}$ | Second light detection layer |
| $A_6$, $A_7$ | Filter layers |
| β | Surface to surface distance between two columns of (coherent) light emitting elements |
| $c_1, c_2; c_3$ | columns |
| d; dA; dB | Thickness of the sample in the first direction |
| $d_v$ | Thickness of the chamber volume in the first direction |
| D; $D_1$; $D_2$ | First direction (e.g. vertically downwards) |
| Δ | Surface to surface distance between two (coherent) light emitting elements in one column, i.e., distance between two rows |
| $γ_{5-6}$ | Surface to surface distance between second light detector and (first) filter element |
| $γ_{5-2}$ | Surface to surface distance between second light detector and (coherent) light emitting device |
| $γ_{2-31}$ | Surface to surface distance between (coherent) light emitting device and sample chamber |
| $γ_{31-7}$ | Surface to surface distance between sample chamber and (second) filter element |
| $γ_{31-4}$ | Surface to surface distance between sample chamber and first light detector |
| $γ_{7-4}$ | Surface to surface distance between (second) filter element and first light detector |
| Λ | Grating constant of the grating or DFB grating structure |
| I | Intensity of the reference light |

| | |
|---|---|
| $I_0$ | Intensity of the propagated light, particularly intensity of the attenuated light |
| $L_D$ | (coherent) light emitted in the first direction with intensity $I_D$ |
| $L_{I4}$ | Incoming light at the first light detector |
| $L_{I5}$ | Incoming light at the second light detector |
| $L_U$ | (coherent) light emitted in the second direction with intensity $I_U$ |
| $L_P$ | Light emitted in the first direction and having propagated through the sample holder, particularly attenuated light |
| $L_S$ | Light emitted in the second direction and having propagated through a solvent in the reference holder, particularly attenuated light |
| $\lambda_1$ | First wavelength of (coherent) light emitting element |
| $\lambda_2$ | Second wavelength of (coherent) light emitting element |
| $\lambda_3$ | Third wavelength of (coherent) light emitting element |
| $\lambda_4$ | Fourth wavelength of (coherent) light emitting element |
| $\lambda_{11}$ | Wavelength of pump radiation |
| $N_2$ | Normal of light emitting layer |
| $N_{31}$ | Normal of sample chamber |
| $N_4$ | Normal of first light detector |
| $N_5$ | Normal of second light detector |
| $N_6$ | Normal of (first) Filter element |
| $N_7$ | Normal of (second) Filter element |
| $r_1, r_2; r_3$ | rows |
| S1; S2; S3; S4; S5; S6; S7, S7A, S7B | Embodiments of sandwich structures |
| $\tau$ | Angle between first light detection layer and (parallel of) light emitting layer in one dimension |
| U; $U_1$; $U_2$ | First direction (e.g. vertically upwards) |
| $V_S$ | Sample volume |

The invention claimed is:

1. An on-chip optical absorption sensor for determining a concentration of a specimen in a sample, the optical absorption sensor comprising:
   at least one light emitting device, configured to emit light in a first direction and a second direction being opposite the first direction when excited by means of a pump radiation;
   at least one sample holder configured to receive the sample, wherein the at least one sample holder is at least partially transparent for the emitted light, such that at least a portion of the light emitted in the first direction can propagate through at least a portion of the sample holder;
   at least one first light detector being arranged to at least partially detect the intensity I of the propagated light having propagated through the sample holder in the first direction; and
   at least one second light detector being arranged to at least partially detect the intensity I of the light emitted in the second direction,
   wherein the on-chip optical absorption sensor has at least one sandwich structure of stacked layers, the one sandwich structure comprising:
   the light emitting device being configured as a substantially planar light emitting layer;
   the sample holder being configured as a substantially planar sample chamber layer;
   the first light detector being configured as a first light detection layer; and
   the second light detector being configured as a second light detection layer; wherein the first light detection layer, the sample chamber layer, the planar light emitting layer and the second light detection layer are stacked in this order along the second direction of the emitted light.

2. An on-chip optical absorption sensor according to claim 1, wherein the at least one light emitting device comprises at least one coherent light emitting device, configured to emit a light which is a coherent light in a first direction and a second direction being opposite the first direction.

3. The on-chip optical absorption sensor of claim 1, wherein the light emitting device is configured as a substantially planar light emitting layer, wherein the normal direction of the light emitting layer is substantially parallel to the first and second directions of the emitted light.

4. The on-chip optical absorption sensor of claim 1, wherein the light emitting device comprises a vertically emitting laser comprising at least one distributed feedback laser, DFB, a distributed Bragg reflector laser, DBR, a vertical-cavity surface-emitting laser, VCSEL, a Vertical External Cavity surface-emitting laser, VECSEL, and/or a tapered laser.

5. The on-chip optical absorption sensor of claim 1, wherein the light emitting device comprises an organic second order DFB laser.

6. The on-chip optical absorption sensor of claim 1, wherein the light emitting device comprises an array of light emitting elements, wherein the light emitting elements are arranged in at least one column and are spaced apart by a distance Δ.

7. The on-chip optical absorption sensor of claim 6, wherein the array of light emitting elements comprises at least two columns of light emitting elements, wherein the at least two columns are spaced apart by a distance β.

8. The on-chip optical absorption sensor of claim 1, wherein the sample holder comprises a sample chamber including at least one chamber volume, wherein the chamber volume includes microfluidic channels for receiving and guiding a fluid sample, and/or holding elements for holding the sample or the sample chamber.

9. The on-chip optical absorption sensor of claim 8, wherein the sample chamber is configured as a substantially planar sample chamber layer, wherein the normal direction of the sample chamber layer is substantially parallel to the first and second directions of the emitted light.

10. The on-chip optical absorption sensor of claim 1, wherein at least two out of the light emitting device, the sample holder, the first light detector and the second light detector are configured as removable and/or replaceable module units.

11. The on-chip optical absorption sensor of claim 1, wherein at least two out of the light emitting device, the sample holder, the first light detector and the second light detector are formed as an integral unit.

12. The on-chip optical absorption sensor of claim 1, further comprising at least one filter element being configured to allow transmission of at least a portion of the emission wavelength range of the emitted light.

13. The on-chip optical absorption sensor of claim 1, wherein the on-chip optical sensor is configured for determining concentrations of one or more specimens in at least two samples.

14. The on-chip optical absorption sensor of claim 13 comprising at least two sandwich structures for determining in each of the sandwich structures the concentration of a specimen of one of the samples.

15. The on-chip optical absorption sensor of claim 13 comprising:
   a first light emitting device configured to emit light having a first wavelength; and
   a second light emitting device configured to emit light having a second wavelength, wherein the first wavelength differs from the second wavelength.

16. The on-chip optical absorption sensor of claim 1, further comprising at least one reference holder configured to receive a reference substance, wherein the reference holder is at least partially transparent for the emitted light, such that at least a portion of the light emitted in the second direction can propagate through at least a portion of the reference holder.

17. A system comprising the on-chip optical absorption sensor of claim 1, and at least one processing unit for determining the concentrations of the specimen in the sample according to:

$$c = -\ln\left(k_I \frac{I}{I_0}\right) / (d\varepsilon^*)$$

wherein I is an attenuated intensity of the propagated light detected by the first light detector, $I_0$ is a reference intensity of the light emitted in the second direction detected by the second light detector, $\varepsilon^*$ is an extinction coefficient of the specimen at a wavelength $\lambda$ of the light, c is a molar concentration of the specimen in the sample, d is a thickness of the sample in the first direction and $k_I$ is a factor taking into account a the relation between the intensities of light being emitted into the first and the second directions.

18. A method for determining a concentration of a specimen in a sample comprises the steps of:
   providing the on-chip optical absorption sensor according to claim 1;
   providing the sample in the sample holder;
   stimulating the light emitting device to emit light;
   at least partially detecting
      the intensity I of the propagated light emitted in the first direction and having propagated through the sample holder by means of the first light detector; and
      the intensity $I_0$ of the light emitted in the second direction by means of the second light detector; and
   determining the concentration of the specimen in the sample according to:

$$c = -\ln\left(k_I \frac{I}{I_0}\right) / (d\varepsilon^*)$$

wherein I is an attenuated intensity of the propagated light detected by the first light detector, $I_0$ is a reference intensity of the light emitted in the second direction detected by the second light detector, $\varepsilon^*$ is an extinction coefficient of the specimen at a wavelength $\lambda$ of the light, c is a molar concentration of the specimen in the sample, d is a thickness of the sample in the first direction and $k_I$ is a factor taking into account a the relation between the intensities of light being emitted into the first and the second directions.

19. A sandwich-type on-chip optical absorption sensor for determining a concentration of a specimen in a sample, the optical absorption sensor comprising in a stacked configuration along the first direction
   a second light detector, which is configured as a second light detection layer;
   a light emitting device comprising an organic second-order DFB laser grating configured as a substantially planar light emitting layer and configured to emit light into a first direction and a second direction when excited by means of a pump radiation, the second direction being opposite to the first direction;
   a sample holder comprising at least one microfluidic channel for receiving and guiding a fluid sample configured as a substantially planar sample chamber layer, wherein the microfluidic channel is at least partially transparent for the emitted light such that at least a portion of the light emitted in the first direction can propagate through at least a portion of the microfluidic channel of the sample chamber layer as propagated light; and
   a first light detector which is configured as a first light detection layer; wherein
      an intensity $I_0$ of the light emitted in the second direction can be at least partially detected by the second light detector as a reference intensity; and
      an intensity I of the propagated light can be at least partially detected by the first light detector as a probe intensity for determining the concentration of the specimen in the sample.

20. The sandwich-type on-chip optical absorption sensor of claim 19, wherein the first and the second directions are substantially parallel to the normal directions of the first light detection layer, the second light detection layer, the light emitting layer and the sample chamber layer.

* * * * *